(12) United States Patent
Yamazaki et al.

(10) Patent No.: US 10,361,258 B2
(45) Date of Patent: Jul. 23, 2019

(54) LIGHT EMITTING DEVICE AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Masahiro Katayama, Tochigi (JP); Shingo Eguchi, Tochigi (JP); Yoshiaki Oikawa, Tochigi (JP); Ami Nakamura, Tochigi (JP); Satoshi Seo, Kanagawa (JP); Kaoru Hatano, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/927,436

(22) Filed: Mar. 21, 2018

(65) Prior Publication Data

US 2018/0212006 A1    Jul. 26, 2018

Related U.S. Application Data

(63) Continuation of application No. 12/651,734, filed on Jan. 4, 2010, now Pat. No. 9,929,220.

(30) Foreign Application Priority Data

Jan. 8, 2009    (JP) .................. 2009-002567

(51) Int. Cl.
*H01L 27/12* (2006.01)
*H01L 27/32* (2006.01)
(Continued)

(52) U.S. Cl.
CPC ........ *H01L 27/3246* (2013.01); *H01L 51/524* (2013.01); *H01L 51/5253* (2013.01);
(Continued)

(58) Field of Classification Search
None
See application file for complete search history.

(56) References Cited

U.S. PATENT DOCUMENTS

| | | |
|---|---|---|
| 4,653,864 A | 3/1987 | Baron et al. |
| 4,759,610 A | 7/1988 | Yanagisawa |

(Continued)

FOREIGN PATENT DOCUMENTS

| | | |
|---|---|---|
| CN | 001533682 A | 9/2004 |
| CN | 001825616 A | 8/2006 |

(Continued)

OTHER PUBLICATIONS

Taiwanese Office Action re Application No. TW 098144795, dated Jan. 26, 2015.

(Continued)

*Primary Examiner* — Fazli Erdem
*Assistant Examiner* — Scott R Wilson
(74) *Attorney, Agent, or Firm* — Husch Blackwell LLP

(57) ABSTRACT

Thinned and highly reliable light emitting elements are provided. Further, light emitting devices in which light emitting elements are formed over flexible substrates are manufactured with high yield. One light emitting device includes a flexible substrate, a light emitting element faulted over the flexible substrate, and a resin film covering the light emitting element, and in the light emitting element, an insulating layer serving as a partition has a convex portion and the convex portion is embedded in the resin film, that is, the resin film covers an entire surface of the insulating layer and an entire surface of the second electrode, whereby the light emitting element can be thinned and highly reliable. In addition, a light emitting device can be manufactured with high yield in a manufacturing process thereof.

16 Claims, 10 Drawing Sheets

(51) Int. Cl.
  *H01L 51/00* (2006.01)
  *H01L 51/52* (2006.01)
  *H05B 33/02* (2006.01)
  *H05B 33/04* (2006.01)
  *H05B 33/12* (2006.01)
  *H01L 29/786* (2006.01)

(52) U.S. Cl.
  CPC ............. *H05B 33/02* (2013.01); *H05B 33/04* (2013.01); *H05B 33/12* (2013.01); *H01L 27/1214* (2013.01); *H01L 27/1218* (2013.01); *H01L 27/1266* (2013.01); *H01L 29/7869* (2013.01); *H01L 51/003* (2013.01); *H01L 51/52* (2013.01); *H01L 2251/5338* (2013.01)

(56) References Cited

U.S. PATENT DOCUMENTS

| | | | |
|---|---|---|---|
| 5,760,643 A | 6/1998 | Whetsel | |
| 5,969,538 A | 10/1999 | Whetsel | |
| 5,994,912 A | 11/1999 | Whetsel | |
| 6,046,600 A | 4/2000 | Whetsel | |
| 6,067,134 A | 5/2000 | Akiyama et al. | |
| 6,166,557 A | 12/2000 | Whetsel | |
| 6,175,345 B1 | 1/2001 | Kuribayashi et al. | |
| 6,262,587 B1 | 7/2001 | Whetsel | |
| 6,274,887 B1 | 8/2001 | Yamazaki et al. | |
| 6,326,801 B1 | 12/2001 | Whetsel | |
| 6,373,187 B1 | 4/2002 | Nagayama et al. | |
| 6,373,453 B1 | 4/2002 | Yudasaka | |
| 6,380,672 B1 | 4/2002 | Yudasaka | |
| 6,420,834 B2 | 7/2002 | Yamazaki et al. | |
| 6,465,268 B2 | 10/2002 | Hirakata et al. | |
| 6,555,968 B2 | 4/2003 | Yamazaki et al. | |
| 6,559,594 B2 | 5/2003 | Fukunaga et al. | |
| 6,614,174 B1 | 9/2003 | Urabe et al. | |
| 6,638,781 B1 | 10/2003 | Hirakata et al. | |
| 6,727,722 B2 | 4/2004 | Whetsel | |
| 6,739,931 B2 | 5/2004 | Yamazaki et al. | |
| 6,743,650 B2 | 6/2004 | Hirakata et al. | |
| 6,750,618 B2 | 6/2004 | Yamazaki et al. | |
| 6,768,257 B1 | 7/2004 | Yamada et al. | |
| 6,781,162 B2 | 8/2004 | Yamazaki et al. | |
| 6,781,746 B2 | 8/2004 | Yamazaki et al. | |
| 6,784,037 B2 | 8/2004 | Yamazaki et al. | |
| 6,787,407 B2 | 9/2004 | Nakamura et al. | |
| 6,815,723 B2 | 11/2004 | Yamazaki et al. | |
| 6,821,827 B2 | 11/2004 | Nakamura et al. | |
| 6,828,726 B2 | 12/2004 | Sakurai et al. | |
| 6,833,668 B1 | 12/2004 | Yamada et al. | |
| 6,836,069 B2 | 12/2004 | Iga | |
| 6,924,594 B2 | 8/2005 | Ogura et al. | |
| 6,927,833 B2 | 8/2005 | Kim et al. | |
| 6,952,020 B1 | 10/2005 | Yamazaki et al. | |
| 6,954,080 B2 | 10/2005 | Whetsel | |
| 6,969,291 B2 | 11/2005 | Urabe et al. | |
| 6,977,394 B2 | 12/2005 | Yamazaki et al. | |
| 6,991,506 B2 | 1/2006 | Yamada et al. | |
| 6,992,439 B2 | 1/2006 | Yamazaki et al. | |
| 6,995,511 B2 | 2/2006 | Yamazaki et al. | |
| 7,012,367 B2 | 3/2006 | Seki | |
| 7,015,503 B2 | 3/2006 | Seki et al. | |
| 7,038,836 B2 | 5/2006 | Yamazaki et al. | |
| 7,057,209 B2 | 6/2006 | Yamazaki et al. | |
| 7,098,602 B2 | 8/2006 | Yamazaki et al. | |
| 7,109,653 B2 | 9/2006 | Imamura | |
| 7,112,115 B1 | 9/2006 | Yamazaki et al. | |
| 7,180,093 B2 | 2/2007 | Takayama et al. | |
| 7,180,319 B2 | 2/2007 | Whetsel | |
| 7,214,959 B2 | 5/2007 | Seki et al. | |
| 7,221,338 B2 | 5/2007 | Yamazaki et al. | |
| 7,230,447 B2 | 6/2007 | Whetsel | |
| 7,264,979 B2 | 9/2007 | Yamagata et al. | |
| 7,265,391 B2 | 9/2007 | Yamazaki et al. | |
| 7,268,490 B2 | 9/2007 | Oota | |
| 7,273,801 B2 | 9/2007 | Seki et al. | |
| 7,362,093 B2 | 4/2008 | Whetsel | |
| 7,362,120 B2 | 4/2008 | Whetsel | |
| 7,378,137 B2 | 5/2008 | Saida et al. | |
| 7,384,860 B2 | 6/2008 | Nakamura et al. | |
| 7,417,253 B2 | 8/2008 | Yamazaki et al. | |
| 7,420,210 B2 | 9/2008 | Yamazaki et al. | |
| 7,442,955 B2 | 10/2008 | Seki et al. | |
| 7,462,384 B2 | 12/2008 | Yamazaki et al. | |
| 7,485,478 B2 | 2/2009 | Yamagata et al. | |
| 7,517,791 B2 | 4/2009 | Morisue et al. | |
| 7,524,228 B2 | 4/2009 | Imamura | |
| 7,572,478 B2 | 8/2009 | Ogura et al. | |
| 7,582,904 B2 | 9/2009 | Fujii et al. | |
| 7,601,236 B2 | 10/2009 | Yamashita et al. | |
| 7,608,997 B2 | 10/2009 | Tanaka | |
| 7,623,098 B2 | 11/2009 | Yamazaki et al. | |
| 7,651,745 B2 | 1/2010 | Saida et al. | |
| 7,662,011 B2 | 2/2010 | Yamazaki et al. | |
| 7,683,535 B2 | 3/2010 | Fukunaga et al. | |
| 7,692,186 B2 | 4/2010 | Yamazaki et al. | |
| 7,695,759 B2 | 4/2010 | Kumagai | |
| 7,697,106 B2 | 4/2010 | Sawasaki et al. | |
| 7,719,014 B2 | 5/2010 | Yamazaki et al. | |
| 7,741,642 B2 | 6/2010 | Takayama et al. | |
| 7,745,993 B2 | 6/2010 | Fukunaga et al. | |
| 7,753,751 B2 | 7/2010 | Yamazaki | |
| 7,792,489 B2 | 9/2010 | Hirakata et al. | |
| 7,808,264 B2 | 10/2010 | Whetsel | |
| 7,825,419 B2 | 11/2010 | Yamagata et al. | |
| 7,892,059 B2 | 2/2011 | Kumagai | |
| 7,923,062 B2 | 4/2011 | Saida et al. | |
| 7,928,656 B2 | 4/2011 | Imamura | |
| 7,932,518 B2 | 4/2011 | Seki et al. | |
| 7,977,876 B2 | 7/2011 | Yamazaki et al. | |
| 7,982,206 B2 | 7/2011 | Yamazaki et al. | |
| 8,049,413 B2 | 11/2011 | Kumagai | |
| 8,089,066 B2 | 1/2012 | Yamazaki et al. | |
| 8,119,468 B2 | 2/2012 | Miyairi et al. | |
| 8,138,032 B2 | 3/2012 | Miyairi et al. | |
| 8,237,164 B2 | 8/2012 | Takayama et al. | |
| 8,237,355 B2 | 8/2012 | Yamazaki | |
| 8,324,922 B2 | 12/2012 | Whetsel | |
| 8,436,338 B2 | 5/2013 | Gregory | |
| 8,786,178 B2 | 7/2014 | Yamazaki | |
| 9,147,713 B2 | 9/2015 | Yamazaki | |
| 2002/0024356 A1 | 2/2002 | Whetsel | |
| 2002/0047514 A1 | 4/2002 | Sakurai et al. | |
| 2002/0158570 A1 | 10/2002 | Yamada et al. | |
| 2002/0180371 A1 | 12/2002 | Yamazaki et al. | |
| 2003/0032210 A1 | 2/2003 | Takayama et al. | |
| 2003/0047280 A1 | 3/2003 | Takayama et al. | |
| 2003/0122140 A1 | 7/2003 | Yamazaki et al. | |
| 2003/0143794 A1 | 7/2003 | Nakamura et al. | |
| 2003/0146695 A1 | 8/2003 | Seki | |
| 2003/0164674 A1 | 9/2003 | Imamura | |
| 2003/0173567 A1 | 9/2003 | Kokubo et al. | |
| 2003/0189400 A1 | 10/2003 | Nishio et al. | |
| 2004/0084673 A1 | 5/2004 | Hirakata et al. | |
| 2004/0135501 A1 | 7/2004 | Nishikawa | |
| 2004/0207789 A1 | 10/2004 | Hirakata et al. | |
| 2004/0218112 A1 | 11/2004 | Hirakata et al. | |
| 2005/0024339 A1 | 2/2005 | Yamazaki et al. | |
| 2005/0036190 A1 | 2/2005 | Tanaka | |
| 2005/0067617 A1 | 3/2005 | Yamazaki et al. | |
| 2005/0140291 A1 | 6/2005 | Hirakata et al. | |
| 2005/0162080 A1 | 7/2005 | Yaegashi | |
| 2005/0200273 A1 | 9/2005 | Nozawa | |
| 2005/0218396 A1 | 10/2005 | Tsuchiya et al. | |
| 2005/0269962 A1* | 12/2005 | Matsunaga | H01L 27/3244 315/169.3 |
| 2006/0081844 A1 | 4/2006 | Hirosue et al. | |
| 2006/0113671 A1 | 6/2006 | Isa et al. | |
| 2006/0199461 A1 | 9/2006 | Yamazaki et al. | |
| 2006/0202615 A1 | 9/2006 | Murakami et al. | |
| 2006/0270305 A1 | 11/2006 | Imamura | |
| 2007/0015430 A1 | 1/2007 | Nishio et al. | |
| 2007/0018566 A1 | 1/2007 | Yamazaki et al. | |

(56) References Cited

U.S. PATENT DOCUMENTS

| | | | |
|---|---|---|---|
| 2007/0045621 A1* | 3/2007 | Suzuki | H01L 27/12 257/40 |
| 2007/0085475 A1 | 4/2007 | Kuwabara et al. | |
| 2007/0105255 A1 | 5/2007 | Nishimura | |
| 2007/0114921 A1 | 5/2007 | Yamazaki et al. | |
| 2007/0165170 A1 | 7/2007 | Fukuda | |
| 2007/0263164 A1* | 11/2007 | Kumagai | H01L 27/3246 349/156 |
| 2007/0267969 A1 | 11/2007 | Nakashima et al. | |
| 2008/0018229 A1 | 1/2008 | Yamazaki | |
| 2008/0067931 A1 | 3/2008 | Ito et al. | |
| 2008/0204065 A1 | 8/2008 | Whetsel | |
| 2008/0246025 A1 | 10/2008 | Nomura et al. | |
| 2008/0266509 A1 | 10/2008 | Nishi et al. | |
| 2008/0280417 A1 | 11/2008 | Yamazaki et al. | |
| 2008/0303424 A1 | 12/2008 | Mitsuya et al. | |
| 2008/0308830 A1 | 12/2008 | Yamazaki et al. | |
| 2009/0020751 A1 | 1/2009 | Seki et al. | |
| 2009/0179566 A1 | 7/2009 | Imamura | |
| 2009/0239320 A1 | 9/2009 | Takayama et al. | |
| 2010/0065834 A1 | 3/2010 | Hammond | |
| 2010/0176720 A1 | 7/2010 | Yamazaki | |
| 2010/0295052 A1 | 11/2010 | Yamazaki et al. | |
| 2010/0320484 A1 | 12/2010 | Hirakata et al. | |
| 2011/0024787 A1 | 2/2011 | Yamagata et al. | |
| 2011/0266548 A1 | 11/2011 | Yamazaki et al. | |
| 2012/0286315 A1 | 11/2012 | Takayama et al. | |
| 2012/0305922 A1 | 12/2012 | Yamazaki | |
| 2013/0049804 A1 | 2/2013 | Whetsel | |
| 2014/0299899 A1 | 10/2014 | Yamazaki | |
| 2016/0005801 A1 | 1/2016 | Yamazaki | |

FOREIGN PATENT DOCUMENTS

| | | |
|---|---|---|
| CN | 101257096 A | 9/2008 |
| CN | 103022073 A | 4/2013 |
| EP | 0 786 667 A2 | 7/1997 |
| EP | 0 989 778 A1 | 3/2000 |
| EP | 1 096 568 A2 | 5/2001 |
| EP | 1 102 317 A2 | 5/2001 |
| JP | 10-321372 A | 12/1998 |
| JP | 11-339958 A | 12/1999 |
| JP | 2000-195675 A | 7/2000 |
| JP | 2000-353594 A | 12/2000 |
| JP | 2001-148291 A | 5/2001 |
| JP | 2001-195008 A | 7/2001 |
| JP | 2001-201750 A | 7/2001 |
| JP | 2001-250777 A | 9/2001 |
| JP | 2002-151252 A | 5/2002 |
| JP | 2002-164181 A | 6/2002 |
| JP | 2002-324666 A | 11/2002 |
| JP | 2003-059671 A | 2/2003 |
| JP | 2003-123969 A | 4/2003 |
| JP | 2003-174153 A | 6/2003 |
| JP | 2003-207788 A | 7/2003 |
| JP | 2003-243171 A | 8/2003 |
| JP | 2003-257650 A | 9/2003 |
| JP | 2004-165067 A | 6/2004 |
| JP | 2005-135929 A | 5/2005 |
| JP | 2005-140976 A | 6/2005 |
| JP | 2005-158494 A | 6/2005 |
| JP | 2005-298634 A | 10/2005 |
| JP | 2005-322564 A | 11/2005 |
| JP | 2006-126817 A | 5/2006 |
| JP | 2006-252839 A | 9/2006 |
| JP | 2006-259049 A | 9/2006 |
| JP | 2007-005138 A | 1/2007 |
| JP | 2007-225716 A | 9/2007 |
| JP | 2007-280866 A | 10/2007 |
| JP | 2007-305357 A | 11/2007 |
| JP | 2008-124448 A | 5/2008 |
| JP | 2008-165251 A | 7/2008 |
| JP | 2009-238456 A | 10/2009 |
| JP | 2009-278081 A | 11/2009 |
| JP | 2009-278082 A | 11/2009 |
| JP | 2010-504608 | 2/2010 |
| KR | 2004-0071438 A | 8/2004 |
| KR | 2005-0063159 A | 6/2005 |
| KR | 2006-0051830 A | 5/2006 |
| KR | 2011-0084857 A | 7/2011 |
| KR | 2012-0065976 A | 6/2012 |
| KR | 10-1819447 | 1/2018 |
| TW | 200302673 | 8/2003 |
| TW | I255153 | 5/2006 |
| TW | I302388 | 10/2008 |
| WO | WO 2003/061346 A1 | 7/2003 |
| WO | WO 2004/040649 A1 | 5/2004 |
| WO | WO 2008/035094 A1 | 3/2008 |
| WO | WO 2008/047928 A1 | 4/2008 |

OTHER PUBLICATIONS

Korean Office Action re Application No. KR 2018-0003093, dated Jan. 22, 2018.

Korean Office Action re Application No. KR 2018-0096703, dated Dec. 5, 2018.

* cited by examiner

LIGHT EMITTING DEVICE AND ELECTRONIC DEVICE

This application is a continuation of copending application Ser. No. 12/651,734 filed on Jan. 4, 2010.

BACKGROUND OF THE INVENTION

1. Field of the Invention

The present invention relates to light emitting devices having light emitting elements that employ electroluminescence. In addition, the present invention relates to electronic devices on which the light emitting devices are mounted as a component.

2. Description of the Related Art

In recent years, thin and flat display devices have been demanded as display devices in televisions, mobile phones, digital cameras, and the like, and as the display devices satisfying this demand, display devices using self-light emitting elements have attracted attention. One of the self-light emitting elements is a light emitting element utilizing electroluminescence (EL), and this light emitting element includes a light emitting material interposed between a pair of electrodes and can provide light emission from the light emitting material by voltage application.

For this kind of self-emitting light emitting element, pixel visibility is high compared to that of a liquid crystal display, there is an advantage that e.g., no backlight is needed, and these self-light emitting elements are suitable for use as flat panel display elements. In addition, such a self-light emitting element has features that the thickness can be reduced and that response speed is extremely high.

As the market of the light emitting devices expands, it is important to make devices into a thinner shape in miniaturizing products, and the thinning technique and the application range of the miniaturized products spread rapidly. For example, in Patent Document 1, a flexible electroluminescence light emitting device using techniques of separation and transfer is proposed.

REFERENCE

Patent Document 1: Japanese Published Patent Application No. 2003-174153

SUMMARY OF THE INVENTION

An object of one embodiment of the present invention is to provide a highly reliable light emitting device which can be thinned. Further, another object of one embodiment of the present invention is to manufacture a light emitting device in which a light emitting element is provided over a flexible substrate, with high yield.

One embodiment of the present invention is a light emitting device including a flexible substrate, a light emitting element formed over the flexible substrate, and a resin film covering the light emitting element. In addition, the light emitting element includes at least a first electrode, an insulating layer covering an end portion of the first electrode and having a convex portion, an EL layer in contact with the first electrode, and a second electrode in contact with the EL layer, and in the resin film covering the light emitting element, the convex portion is embedded. That is, the resin film covers an entire surface of the insulating layer and an entire surface of the second electrode.

One embodiment, of the present invention is a light emitting device including a first flexible substrate, the light emitting element formed over the first flexible substrate, a resin film covering the light emitting element, and a second flexible substrate formed over the resin film. In addition, the light emitting element includes at least a first electrode, an insulating layer covering an end portion of the first electrode and having a convex portion, an EL layer in contact with the first electrode, and a second electrode in contact with the EL layer, and in the resin film covering the light emitting element, the convex portion is embedded. That is, the resin film covers an entire surface of the insulating layer and an entire surface of the second electrode.

One embodiment of the present invention is a light emitting device including a first flexible substrate, a light emitting element formed over the first flexible substrate, a resin film covering the light emitting element, and a second flexible substrate formed over the resin film. In addition, the light emitting element includes at least a first electrode, a first insulating layer covering an end portion of the first electrode, a second insulating layer which is in contact with the first insulating layer and whose contact area with the first insulating layer is smaller than a top area of the first insulating layer, an EL layer in contact with the first electrode, and a second electrode in contact with the EL layer, and in the resin film covering the light emitting element, the second insulating layer is embedded. That is, the resin film covers an entire surface of the second insulating layer and an entire surface of the second electrode.

In the light emitting element of any of the above-mentioned embodiments of the present invention, one or both of the first substrate and the second substrate is/are a structure in which a fibrous body is impregnated with an organic resin.

Note that in this specification, the term "light emitting element" includes elements whose luminance is controlled by current or voltage, and specifically includes inorganic electroluminescent (EL) elements, organic EL elements, and the like.

The light emitting device disclosed in this specification may be either a passive matrix light emitting device or an active matrix light emitting device.

In addition, the light emitting device in this specification includes image display devices, light emitting devices, and light sources (including lighting devices).

Further, the light emitting device includes all types of modules such as modules in which a connector such as an FPC (Flexible Printed Circuit), a TAB (Tape Automated Bonding) tape, or a TCP (Tape Carrier Package) is attached to a panel; modules having a TAB tape or a TCP provided with a printed wiring board at the end thereof; and modules having an IC (Integrated Circuit) directly mounted on a light emitting device by a COG (Chip On Glass) method.

Note that terms of degree such as "the same", "equal", "substantially the same", "about" and "approximately" as used herein mean a reasonable amount of deviation of the term such that the end result is not significantly changed. These terms of degree should be construed as including a deviation of at least ±5% of the term if this deviation would not negate the meaning of the word it modifies.

Note that the ordinal numbers such as "first" and "second" in this specification are used for convenience and do not denote the order of steps and the stacking order of layers. In addition, the ordinal numbers in this specification do not denote particular names which specify this invention.

According to one embodiment of the present invention, a light emitting device which has high reliability and is thinned can be provided. Besides, according to one embodiment of the present invention, defects of a shape or characteristics can be prevented also in a manufacturing process of a light emitting device, whereby a light emitting device can be manufactured with high yield.

DETAILED DESCRIPTION OF THE INVENTION

Figure 1:
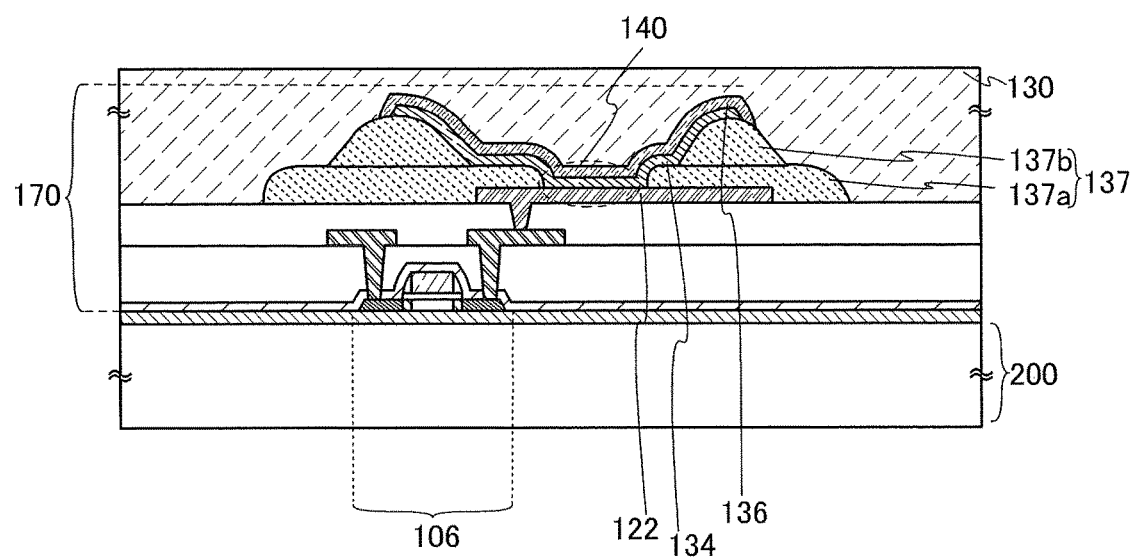
FIG. 1 illustrates a light emitting device according to one embodiment of the present invention.

Hereinafter, embodiments of the present invention will be described in detail with reference to the accompanying drawings. Note that the present invention is not limited to the description below and the modes and details of the present invention can be modified in various ways without departing from the spirit and scope of the present invention. Therefore, the present invention is not interpreted as being limited to the description of the embodiments below. In the structures to be given below, the same portions or portions having similar functions are denoted by the same reference numerals in different drawings, and explanation thereof will not be repeated.

Embodiment 1

In Embodiment 1, an example of a light emitting device will be described in detail with reference to FIG. 1.

A display portion of a light emitting device of this embodiment is illustrated in FIG. 1. The light emitting device of this embodiment illustrated in FIG. 1 includes an element portion 170 formed over a substrate 200. In addition, the element portion 170 is covered with a resin film 130.

As the substrate 200, a flexible substrate can be used. For example, any of polyester resins such as polyethylene terephthalate (PET) and polyethylene naphthalate (PEN), a polyacrylonitrile resin, a polyimide resin, a polymethylmethacrylate resin, a polycarbonate resin (PC), a polyethersulfone resin (PES), a polyamide resin, a cycloolefin resin, a polystyrene resin, a polyamideimide resin, a polyvinyl chloride resin and the like can be preferably used. Alternatively, as the substrate 200, a structure in which a fibrous body is impregnated with an organic resin can be used. Note that when light is transmitted through the substrate 200, a substrate having a light-transmitting property is used as the substrate 200.

The element portion 170 is formed over the substrate 200. The element portion 170 includes at least a light emitting element 140 and a switching element configured to give an electric potential to the light emitting element 140. As the switching element, for example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a thyristor, or the like can be used. Alternatively, a logic circuit in which such elements are combined can be used as the switching element. In this embodiment, a thin film transistor 106 is used as the switching element. In addition, a driver circuit portion may be included in the element portion 170 as a driver integrated type light emitting device. Note that a driver circuit can be formed outside the substrates which are sealed.

The light emitting element 140 includes a first electrode 122, insulating layers 137 covering end portions of the first electrode, an EL layer 134, and a second electrode 136. One of the first electrode 122 and the second electrode 136 serves as an anode and the other thereof serves as a cathode.

The EL layer 134 included in the light emitting element includes at least a light emitting layer. In addition, the EL layer 134 can have a stacked structure including a hole injecting layer, a hole transporting layer, an electron transporting layer, an electron injecting layer, and the like, in addition to the light emitting layer. The EL layer 134 can be formed using either a low molecular material or a high molecular material. Note that the material forming the EL layer 134 is not limited to a material containing only an organic compound material, and may contain an inorganic compound material.

Note that when the light emitting device performs full color display, materials exhibiting red (R), green (G), and blue (B) may be used by selectively forming the EL layer 134. In the case of monochrome display, a material exhibiting at least one color may be used to form the EL layer 134. In addition, an EL layer and color filters (not illustrated) may be combined. Even in the case where a single color light emitting layer (for example, a white light emitting layer) is used, full-color display is possible by color filters. For example, when an EL layer for white (W) light emission and color filters are combined, it is possible that full color display is performed with four subpixels, that is, a pixel without a color filter and RGB pixels.

The insulating layer 137 includes a convex portion. In this embodiment, the insulating layer 137 has a two-layer structure of a first insulating layer 137a and a second insulating layer 137b. In addition, the insulating layer 137 is formed using an inorganic material such as an oxide of silicon or a nitride of silicon; an organic material such as polyimide, polyamide, benzocyclobutene, acrylic, or epoxy; a siloxane material; or the like. In addition, the first insulating layer 137a and the second insulating layer 137b constituting the insulating layer 137 may be formed using the same material or different materials from each other.

The element portion 170 formed over the substrate 200 is covered with the resin film 130. Examples of materials used for formation of the resin film 130 include an organic compound such as acrylic resins, polyimide resins, melamine resins, polyester resins, polycarbonate resins, phenol resins, epoxy resins, polyacetal, polyether, polyurethane, polyamide (nylon), furan resins, or diallylphthalate resins; inorganic siloxane polymers including a Si—O—Si bond compounds including silicon, oxygen, and hydrogen, formed by using a siloxane-polymer-based material typified by silica glass as a starting material; or organic siloxane polymers in which hydrogen bonded with silicon is substituted by an organic group such as methyl or phenyl, typified by alkylsiloxane polymers, alkylsilsesquioxane polymers, silsesquioxane hydride polymers, alkylsilsesquioxane hydride polymers. Alternatively, a structure in which a fibrous body is impregnated with an organic resin can be used as the resin film 130.

In addition, when light is extracted from the second electrode 136 side of the light emitting element 140, the resin film 130 is formed using a material having a light-transmitting property or is formed so as to have a thickness small enough to transmit light at least on a display surface of the light emitting device. On the other hand, when light is extracted only from the first electrode 122 side of the light emitting element 140, the resin film 130 is not necessarily formed using a material having a light-transmitting property.

In the light emitting element 140 included in the light emitting device described in this embodiment, the insulating layer 137 serving as a partition (bank) is an insulating layer having a convex portion. Note that in FIG. 1, the insulating layer 137 including the first insulating layer 137a and one second insulating layer 137b formed over one first insulating layer 137a is illustrated. However, the shape of the insulating layer 137 is not limited to that, and may have two or more convex portions. The insulating layer 137 has a convex portion and the convex portion is embedded in the resin film 130, so that the fixing strength of the insulating layer 137 and the resin film 130 can be increased. As a result, the thus formed light emitting device can have high reliability. In addition, as the fixing strength of the insulating layer 137 and the resin film 130 is increased, peeling does not occur inside the light emitting element in the manufacturing process of the light emitting device, and thus the light emitting element can be transferred to a flexible substrate. Accordingly, a highly reliable light emitting device can be manufactured with high yield.

Further, when the element portion 170 is formed thin, the light emitting device can be flexible. Therefore, the light emitting device of this embodiment can be bonded to various base materials. When the light emitting device of this embodiment is attached to a base material having a curved surface, a display having a curved surface or a lighting device having a curved surface can be realized. In addition, when the thickness of the element portion 170 is small, the weight of the light emitting device can be reduced.

This embodiment can be combined with any of the embodiments as appropriate.

Embodiment 2

In Embodiment 2, another example of a light emitting device will be described with reference to FIG. 2. Note that description of the portions that are the same as or similar to those of Embodiment 1 is omitted or simplified.

Figure 2:
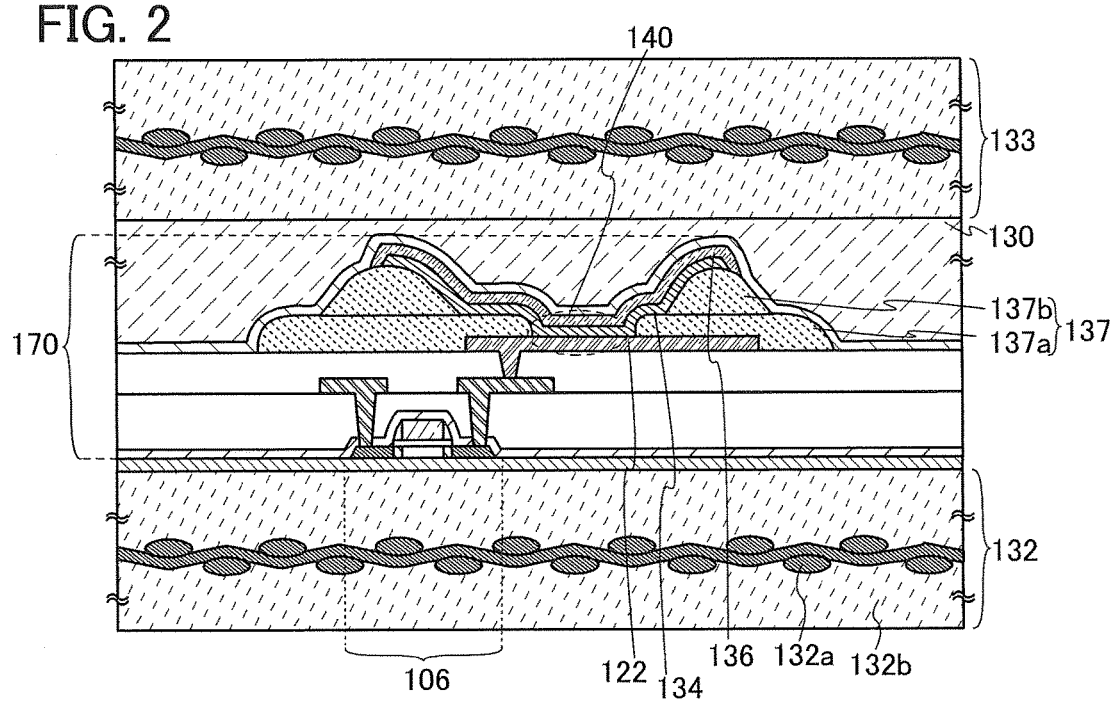
FIG. 2 illustrates a light emitting device according to one embodiment of the present invention.

A display portion of a light emitting device of this embodiment is illustrated in FIG. 2. The light emitting device of this embodiment illustrated in FIG. 2 has the element portion 170 disposed between the first substrate 132 and the second substrate 133. In addition, the resin film 130 is formed between the element portion 170 and the second substrate 133. In FIG. 2, the resin film 130 can be formed using a similar material to the resin film 130 described in Embodiment 1.

As the first substrate 132 and the second substrate 133, flexible substrates can be used, and preferable examples of the substrates include polyester resins such as polyethylene terephthalate (PET) and polyethylene naphthalate (PEN), polyacrylonitrile resins, polyimide resins, polymethylmethacrylate resins, polycarbonate resins (PC), polyethersulfone resins (PES), polyamide resins, cycloolefin resins, polystyrene resins, polyamideimide resins, polyvinyl chloride resins and the like. Note that at least the substrate disposed on the side where light is extracted from the light emitting element should be a substrate having a light-transmitting property.

Note that the first substrate 132 and the second substrate 133 are preferably formed of materials having low coefficients of thermal expansion which are substantially equal. In addition, more preferably, the first substrate 132 and the second substrate 133 are formed of the same material. Note that it is preferable to set the coefficients of thermal expansion of the first substrate 132 and the second substrate 133 20 ppm/° C. or lower, because heat resistance of the light emitting device is improved.

In this embodiment, as the first substrate 132 and the second substrate 133, structures in which a fibrous body 132a is impregnated with an organic resin 132b are used. The structures used for the first substrate 132 and the second substrate 133 are preferably materials having the modulus of elasticity 13 GPa or higher and the modulus of rupture lower than 300 MPa. The thicknesses of the first substrate 132 and the second substrate 133 are preferably in the range of from 5 μm to 50 μm, and preferably being equal. When the thickness of the first substrate 132 is equal to that of the second substrate 133, the element portion 170 can be disposed at a center portion of the light emitting device. In addition, by employing the thicknesses of the first substrate and the second substrate in the range of from 5 μm to 50 μm, the thicknesses of the first substrate and the second substrate are larger than that of the element portion, and thus the element portion is disposed substantially at the center portion and a light emitting device which can resist bending stress can be provided.

In this embodiment, the fibrous body 132a in the structures used as the first substrate 132 and the second substrate 133 is woven from warp yarns spaced at regular intervals and weft yarns spaced at regular intervals. Such a fibrous body which is woven using the warp yarns and the weft yarns has regions where the warp yarns and the weft yarns are not present. In that case, the fibrous body 132a is more easily impregnated with the organic resin 132b, whereby adhesion between the fibrous body 132a and a light emitting element can be increased.

Alternatively, the fibrous body 132a may be ones whose density of the warp yarns and the weft yarns is high and proportion of the regions where the warp yarns and the weft yarns are not present is low.

Further, in order to enhance permeability of the organic resin into the inside of the yarn bundle, the yarn bundle may be subjected to surface treatment. For example, as the surface treatment, corona discharge, plasma discharge, or the like for activating a surface of the yarn bundle can be given. Further, surface treatment using a silane coupling agent or a titanate coupling agent can be given.

Note that a plurality of structures in which a fibrous body is impregnated with an organic resin may be stacked. In that case, the structure may be a stack of a plurality of structures in each of which a single-layer fibrous body is impregnated with an organic resin or a structure formed in which a plurality of fibrous bodies stacked are impregnated with an organic resin may be used for the first substrate 132 or the second substrate 133. Further, in stacking a plurality of structures in each of which a single-layer fibrous body is impregnated with an organic resin, another layer may be disposed between the structures.

The element portion 170 disposed between the first substrate 132 and the second substrate 133 includes at least the light emitting element 140 and a switching element configured to give an electric potential to the light emitting element 140. In this embodiment, the thin film transistor 106 is used as the switching element. In addition, a driver circuit portion may be included in the element portion 170 as a driver integrated type light emitting device. Note that the driver circuit can be formed outside the substrates which are sealed.

The light emitting element 140 includes the first electrode 122, the insulating layers 137 covering end portions of the first electrode, the EL layer 134, and the second electrode 136. One of the first electrode 122 and the second electrode 136 serves as an anode and the other thereof serves as a cathode. The light emitting element 140 in FIG. 2 can be configured in a similar manner to the light emitting element 140 described in Embodiment 1.

The insulating layer 137 includes a convex portion. In this embodiment, the insulating layer 137 has a two-layer structure of the first insulating layer 137a and the second insulating layer 137b. In addition, the insulating layer 137 is formed using an inorganic material such as an oxide of silicon or a nitride of silicon; an organic material such as polyimide, polyamide, benzocyclobutene, acrylic, or epoxy; a siloxane material; or the like. In addition, the first insulating layer 137a and the second insulating layer 137b constituting the insulating layer 137 may be formed using the same material or different materials from each other.

The insulating layer 137 has a convex portion and the convex portion is embedded in the resin film 130, that is, the resin film 130 covers an entire surface of the insulating layer 137 and an entire surface of the second electrode 136, whereby the fixing strength of the insulating layer 137 and the resin film 130 can be improved. Therefore, the thus formed light emitting device can have high reliability. By improvement of the fixing strength of the insulating layer 137 and the resin film 130, peeling does not occur inside the light emitting element in the manufacturing process of the light emitting device, and thus the light emitting element can be transferred to a flexible substrate. Accordingly, a highly reliable light emitting device can be manufactured with high yield.

In this embodiment, the fibrous bodies 132a included in the structures used for the first substrate and the second substrate are formed from high-strength fiber, which has a high elongation modulus or a high Young's modulus. Accordingly, even when the local pressure such as point pressure or linear pressure is applied to the light emitting device, the high-strength fiber is not stretched. Pressing force is dispersed throughout the fibrous bodies 132a, and the whole light emitting device is curved. As a result, even if local pressure is applied, the curve to be generated in the light emitting device has a large radius of curvature, whereby the light emitting element a wiring, and the like disposed between a pair of structures are not cracked and damages to the light emitting device can be reduced.

Further, when the element portion 170 is formed thin, the light emitting device can be flexible. Therefore, the light emitting device of this embodiment can be bonded to various base materials. When the light emitting device of this embodiment is attached to a base material having a curved surface, a display having a curved surface or a lighting device having a curved surface can be realized. In addition, when the thickness of the element portion 170 is small, the weight of the light emitting device can be reduced.

This embodiment can be combined with any of the embodiments as appropriate.

Embodiment 3

In Embodiment 3, an example of a method for manufacturing the light emitting device described in Embodiment 2 will be described in detail with drawings.

Figure 3A:
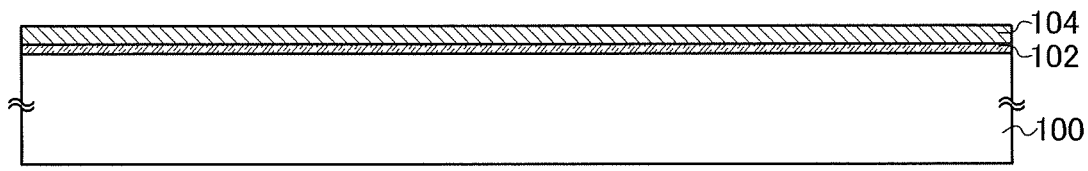
FIGS. 3A to 3D illustrate a method for manufacturing a light emitting device according to one embodiment of the present invention.

First, a separation layer 102 is formed on a surface of a substrate 100 and then, the insulating layer 104 is formed (see FIG. 3A). The separation layer 102 and the insulating layer 104 can be formed successively. The successive formation does not cause exposure to air, and thus contamination of impurities can be prevented.

As the substrate 100, a glass substrate, a quartz substrate, a metal substrate, a stainless steel substrate, or the like can be used. For example, by using a rectangular glass substrate with a side of one meter or more, productivity can be significantly increased.

Note that the separation layer 102 is formed on the entire surface of the substrate 100 in this process; however, after the separation layer 102 is formed on the entire surface of the substrate 100, the separation layer 102 may be selectively removed so that the separation layer can be provided only in a desired region as necessary. In addition, although the separation layer 102 is formed in contact with the substrate 100, an insulating layer such as a silicon oxide film, a silicon oxynitride film, a silicon nitride film, or a silicon nitride oxide film may be formed in contact with the substrate 100 as necessary, and the separation layer 102 may be formed in contact with the insulating layer.

The separation layer 102 is formed with a single layer structure or a stacked structure of layers with a thickness of 30 nm to 200 nm, which is formed from an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of the above elements as its main component by a sputtering method, a plasma CVD method, a coating method, a printing method, or the like. The crystalline structure of a layer containing silicon may be amorphous, microcrystalline, or polycrystalline. Here, a coating method is a method by which a film is formed by discharging a solution on an object to be processed and examples of the coating method include a spin coating method and a droplet discharging method. A droplet discharging method is a method of forming a predetermined pattern by discharging a droplet including a composition containing particles from a small hole.

When the separation layer 102 has a single layer structure, the separation layer 102 is preferably formed by using a layer containing tungsten, molybdenum, or a mixture of tungsten and molybdenum. Alternatively, the separation layer 102 is formed using a layer containing an oxide or oxynitride of tungsten, or a layer containing an oxide or an oxynitride of a mixture of tungsten and molybdenum. Note that the mixture of tungsten and molybdenum corresponds to an alloy of tungsten and molybdenum, for example.

When the separation layer 102 has a stacked structure, preferably, a metal layer is formed as a first layer, and a metal oxide layer is formed as a second layer. For example, as the first-metal layer, a layer containing tungsten or molybdenum or a layer containing a mixture of tungsten and molybdenum is formed. As the second layer, any one of a layer containing oxide of tungsten or molybdenum, a layer containing oxide of a mixture of tungsten and molybdenum, a layer containing nitride of tungsten, a layer containing nitride of a mixture of tungsten and molybdenum, a layer containing oxynitride of tungsten, a layer containing oxynitride of a mixture of tungsten and molybdenum, a layer containing nitride oxide of tungsten, and a layer containing nitride oxide of a mixture of tungsten and molybdenum is formed.

In the case where the separation layer 102 has a stacked structure in which a metal layer is formed as the first layer and a metal oxide layer is formed as the second layer, the stacked structure may be formed in such a way that a layer containing tungsten is formed as the metal layer, and an insulating layer formed of an oxide is formed thereover, whereby a layer containing an oxide of tungsten is formed as the metal oxide layer at the interface between the layer containing tungsten and the insulating layer. Moreover, the metal oxide layer may be fainted in such a manner that the surface of the metal layer is subjected to thermal oxidation treatment, oxygen plasma treatment, treatment using a solution having strong oxidizability such as ozone water, or the like.

The insulating layer 104 serves as a protective layer and is provided to facilitate separation at the interface between the separation layer 102 and the insulating layer 104 in a later separation step or to prevent a semiconductor element and a wiring from being cracked or damaged in a later separation step. For example, the insulating layer 104 is formed using an inorganic compound to be a single layer or a stacked layer by a sputtering method, a plasma CVD method, a coating method, a printing method, or the like. Typical examples of the inorganic compound include silicon oxide, silicon nitride, silicon oxynitride, silicon nitride oxide, and the like. When silicon nitride, silicon nitride oxide, silicon oxynitride, or the like is used for the insulating layer 104, entry of moisture or gas such as oxygen from outside into the element layer to be formed later can be prevented. The thickness of the insulating layer functioning as a protective layer is preferably from 10 nm to 1000 nm, more preferably, from 100 nm to 700 nm.

Figure 3B:
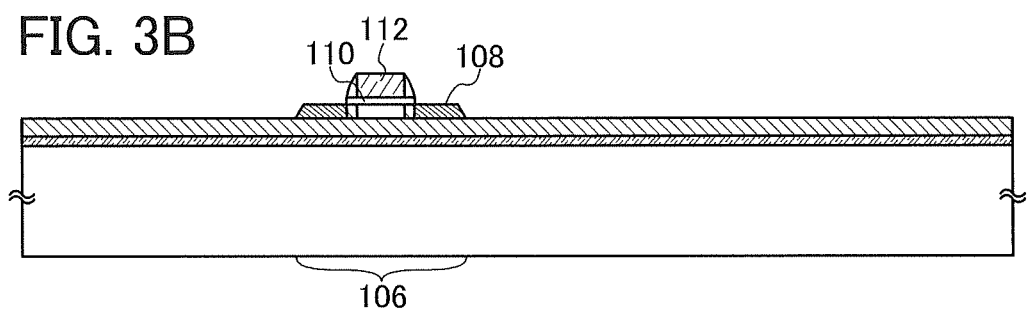

Next, the thin film transistor 106 is formed over the insulating layer 104 (FIG. 3B). The thin film transistor 106 is formed using at least a semiconductor layer 108 having a source region, a drain region, and a channel formation region; a gate insulating layer 110; and a gate electrode 112.

The semiconductor layer 108 is formed to have a preferable thickness in the range of from 10 nm to 100 nm, a more preferable thickness in the range of from 20 nm to 70 nm. Examples of the material used to form the semiconductor layer 108 include amorphous semiconductors formed by a vapor deposition method or a sputtering method using a semiconductor material typified by silane or germane, polycrystalline semiconductors or microcrystalline semiconductors formed by crystallizing the amorphous semiconductors utilizing light energy or thermal energy, semiconductors including an organic material as a main component, and the like. When a crystalline semiconductor layer is used as the semiconductor layer, the crystalline semiconductor layer is formed by laser irradiation, heat treatment such as rapid thermal annealing (RTA) or furnace annealing, or a combination of the methods. In the heat treatment, a crystallization method using a metal element having a function to promote crystallization of silicon semiconductor, such as nickel, can be used.

In addition, a compound semiconductor such as GaAs, InP, SiC, ZnSe, GaN, or SiGe as well as an element such as silicon (Si) or germanium (Ge) can be used as a material of the semiconductor. Further, an oxide semiconductor such as zinc oxide (ZnO), tin oxide ($SnO_2$), magnesium zinc oxide, gallium oxide, or indium oxide, an oxide semiconductor formed of some of the above oxide semiconductors, or the like may be used. For example, an oxide semiconductor formed of zinc oxide, indium oxide, and gallium oxide may be used. In the case of using zinc oxide for the semiconductor layer, a gate insulating layer is preferably formed using $Y_2O_3$, $Al_2O_3$, $TiO_2$, or a stack of any of these. For the gate electrode layer, the source electrode layer, or the drain electrode layer, ITO, Au, Ti, or the like is preferably used. In addition, In, Ga, or the like can be added to ZnO.

The gate insulating layer 110 is made of an inorganic insulator such as silicon oxide or silicon oxynitride to a thickness of 5 nm to 200 nm, and preferably 10 nm to 100 nm.

The gate electrode 112 can be formed using a metal or a polycrystalline semiconductor to which an impurity with one conductivity type is added. In the case of using a metal, tungsten (W), molybdenum (Mo), titanium (Ti), tantalum (Ta), aluminum (Al), or the like can be used. Moreover, metal nitride obtained by nitriding a metal can also be used. Alternatively, a structure in which a first layer including the metal nitride and a second layer including the metal are stacked may be used. By forming the first layer using metal nitride, the first layer can be used as a barrier metal. In other words, the metal of the second layer can be prevented from diffusing into the gate insulating layer or into the semiconductor layer that is provided below the gate insulating layer. In the case of employing such a stacked structure, the gate electrode may have a shape in which the end portion of the first layer extends beyond the end portion of the second layer.

The thin film transistor 106 which is formed from combination of the semiconductor layer 108, the gate insulating layer 110, the gate electrode 112, and the like can employ any of various kinds of structures such as a single drain structure, an LDD (lightly doped drain) structure, and a gate overlap drain structure. The thin film transistor 106 is a thin film transistor having an LDD structure in which low-concentration impurity regions are formed with use of insulating layers (also referred to as sidewalls) in contact with the sides of the gate electrode 112. Moreover, a multi-gate structure where transistors, to which gate voltage having the same potential is applied, are serially connected if shown in an equivalent circuit; a dual-gate structure where the semiconductor layer is sandwiched by gate electrodes thereunder and thereover; or the like can be used. Note that although the top gate type thin film transistor is illustrated in drawings as an example, a bottom gate type thin film transistor or a thin film transistor with other known structures may be used.

As the thin film transistor, a thin film transistor using a metal oxide or an organic semiconductor material for a semiconductor layer can be used. Typical examples of the metal oxide include zinc oxide, oxide of zinc gallium indium, and the like.

In a case where a thin film transistor is formed by a relatively low temperature (lower than 500° C.) process, the separation layer 102 is preferably formed with a single layer or a stacked layer of molybdenum (Mo), an alloy including molybdenum as a main component, and/or a compound material including a molybdenum element.

Figure 3C:
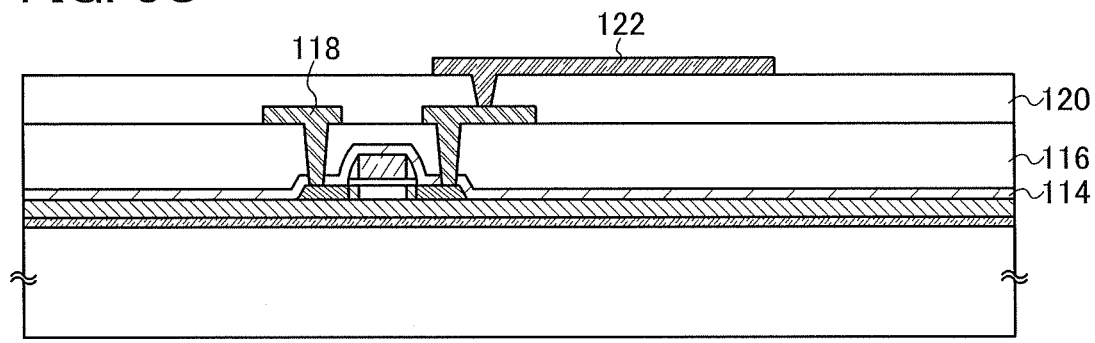

Next, wirings 118 that are electrically connected to a source region and a drain region of the thin film transistor 106 are formed, and the first electrode 122 that is electrically connected to the wiring 118 is formed (FIG. 3C).

Here, insulating layers 114 and 116 are formed to cover the thin film transistor 106, and the wirings 118 capable of functioning also as the source and drain electrodes are formed over the insulating layer 116. Then, an insulating layer 120 is formed over the wirings 118, and the first electrode 122 is formed over the insulating layer 120.

The insulating layers 114 and 116 serve as interlayer insulating layers. The insulating layers 114 and 116 are formed to have a single layer or a stacked layer of an inorganic material such as oxide of silicon or nitride of silicon; an organic material such as polyimide, polyamide, benzocyclobutene, acrylic, or epoxy; a siloxane material; or the like by a CVD method, a sputtering method, an SOG method, a droplet discharging method, a screen printing method, or the like. Here, a silicon nitride oxide film can be formed as the insulating layer 114 as the first layer, and a silicon oxynitride film can be formed as the insulating layer 116 as the second layer.

The wirings 118 are preferably formed in combination of a low resistance material such as aluminum (Al) with barrier metal using a high melting point metal material such as titanium (Ti) or molybdenum (Mo), for example, a stacked layer structure of titanium (Ti) and aluminum (Al), a stacked layer structure of molybdenum (Mo) and aluminum (Al), or the like.

The insulating layer 120 is formed with a single layer or a stacked layer of an inorganic material such as oxide of silicon or nitride of silicon; an organic material such as polyimide, polyamide, benzocyclobutene, acrylic, or epoxy; a siloxane material; or the like by a CVD method, a sputtering method, a SOG method, a droplet discharging method, a screen printing method, or the like. Here, the insulating layer 120 is formed of an epoxy resin by screen printing.

Note that the first electrode 122 is an electrode used as an anode or cathode of the light emitting element. A material having a high work function is preferably used when the first electrode 122 serves as an anode. For example, a single layer film such as an indium tin oxide film, an indium tin oxide film containing silicon, a light-transmitting conductive film formed by a sputtering method using a target in which indium oxide is mixed with zinc oxide (ZnO) of 2 wt % to 20 wt %, a zinc oxide (ZnO) film, a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and another titanium nitride film; or the like. When the anode has a stacked structure, the anode can have low resistance as a wiring and form a favorable ohmic contact.

A material having a low work function (Al, Ag, Li, Ca, or an alloy thereof such as MgAg, MgIn, AlLi, CaF$_2$, or calcium nitride) is preferably used when the first electrode 122 serves as a cathode. When a first electrode 122 used as the cathode has a light-transmitting property, a stacked layer of a metal thin film with a small thickness and a light-transmitting conductive film (an indium tin oxide film, an indium tin oxide film containing silicon, a light-transmitting conductive film formed by a sputtering method using a target in which indium oxide is mixed with zinc oxide (ZnO) of 2 wt % to 20 wt %, a zinc oxide (ZnO) film, or the like) is preferably used as the electrode.

Figure 3D:
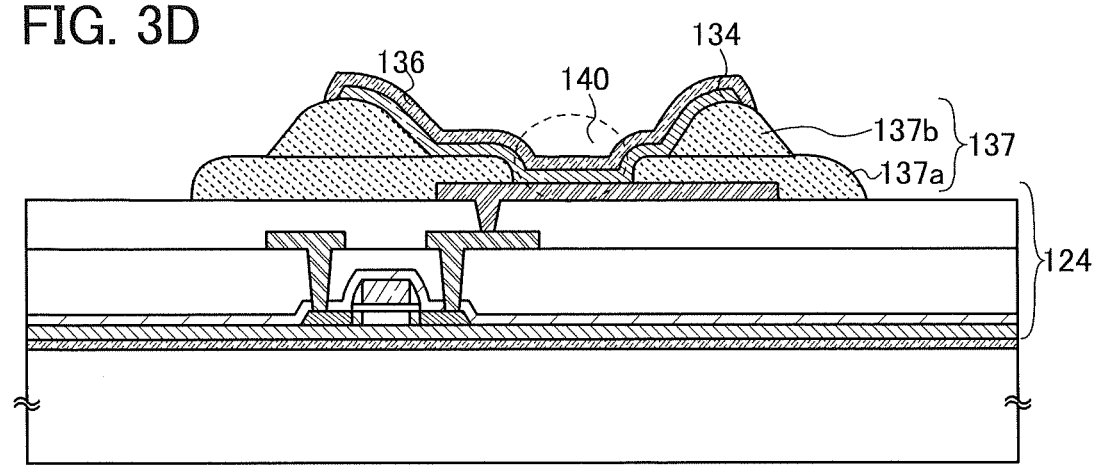

Next, the first insulating layers 137a are formed to cover end portions of the first electrode 122 (FIG. 3D). In this embodiment, the first insulating layer 137a is formed using a positive photosensitive acrylic resin film In order that the first insulating layer 137a can have high coverage, curved surfaces having curvatures are preferably formed in its upper end portion or lower end portion. For example, if positive type photosensitive acrylic is used as a material of the first insulating layer 137a, the first insulating layer 137a is preferably formed to have a curved surface with a curvature radius (0.2 to 3 μm) only at its upper end portion. Either a negative type which becomes insoluble in an etchant by light irradiation or a positive type which becomes soluble in an etchant by light irradiation can be used as the first insulating layer 137a. Alternatively, the first insulating layer 137a can be provided with a single layer structure or a stacked structure of an inorganic material such as an oxide of silicon or a nitride of silicon, an organic material such as epoxy, polyimide, polyamide, polyvinylphenol, or benzocyclobutene, or a siloxane material such as a siloxane resin.

Next, the second insulating layers 137b are formed over the first insulating layer 137a. The second insulating layer 137b is formed of an inorganic material such as an oxide of silicon or a nitride of silicon, an organic material such as polyimide, polyamide, benzocyclobutene, acrylic, or epoxy, or a siloxane material, similarly to the first insulating layer 137a. Note that the first insulating layer 137a and the second insulating layer 137b may be formed of the same material or may be formed of different materials from each other. In addition, preferably, the area of the contact portion of the first insulating layer 137a and the second insulating layer 137b is smaller than the top area of the first insulating layer 137a, and the second insulating layer 137b can be provided within the area on the first insulating layer 137a. Note that the second insulating layer 137b can be formed by a screen printing method, an inkjet method or the like as well as a photolithography process. In this manner, the insulating layers 137 each having a two-layer structure of the first insulating layer 137a and the second insulating layer 137b are formed.

In addition, plasma treatment can be performed on the insulating layer 137 to oxidize or nitride the insulating layer 137; accordingly, a surface of the insulating layer 137 is modified and thus a dense film can be obtained. By modifying the surface of the insulating layer 137, the strength of the insulating layer 137 can be improved, and physical damage such as crack generation at the time of forming an opening portion or the like or film reduction at the time of etching can be reduced.

Next, the EL layer 134 is formed over the first electrode 122. The EL layer 134 can be formed using either a low molecular material or a high molecular material. Note that the material forming the EL layer 134 is not limited to a material containing only an organic compound material, and the material used for the EL layer 134 may partially contain an inorganic compound material. The EL layer 134 may have at least a light emitting layer, and a single layer of light emitting layer or a stacked structure including layers having different functions may be used. For example, functional layers such as a hole injecting layer, a hole transporting layer, a carrier-blocking layer, an electron transporting layer, an electron injecting layer, and the like can be combined as appropriate in addition to the light emitting layer. Note that a layer having two or more of the functions of the layers may be included.

In addition, the EL layer 134 can be formed by either a wet process or a dry process, such as an evaporation method, an inkjet method, a spin coating method, a dip coating method, or a nozzle printing method.

Next, the second electrode 136 is formed over the EL layer 134. Accordingly, the light emitting element 140 in which the first electrode 122, the insulating layers 137 covering the end portions of the first electrode 122, the EL layer 134, and the second electrode 136 are stacked can be formed. Note that one of the first electrode 122 and the second electrode 136 is used as an anode, and the other thereof is used as a cathode.

In this embodiment, the first electrode 122 is used as the anode, and the EL layer 134 has a structure in which a hole injecting layer, a hole transporting layer, a light emitting layer, an electron injecting layer are sequentially stacked over the first electrode 122. Various kinds of materials can be used for the light emitting layer. For example, a fluorescent compound that exhibits fluorescence or a phosphorescent compound that exhibits phosphorescence can be used.

In addition, when the first electrode 122 serves as a cathode, the thin film transistor 106 connected to the first electrode 122 is preferably an n-channel transistor.

Figure 4A:
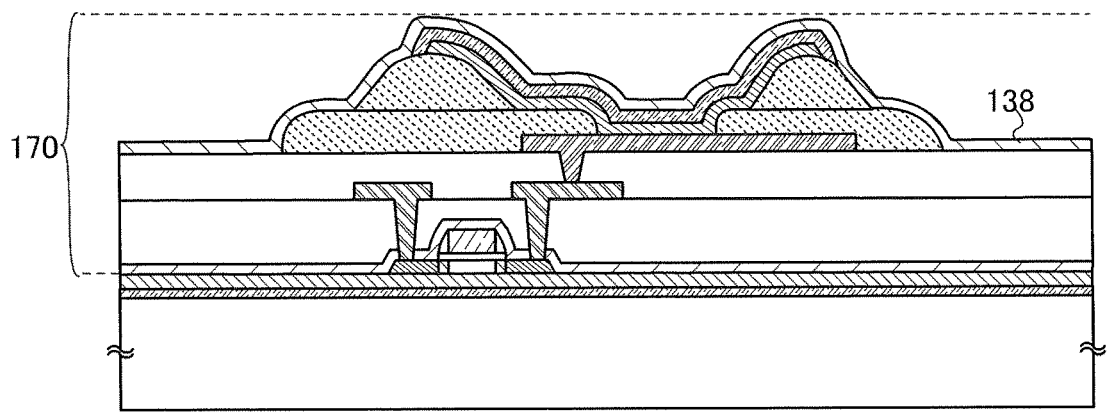
FIGS. 4A to 4C illustrate the method for manufacturing the light emitting device according to one embodiment of the present invention.

Next, the insulating layer 138 is formed over the second electrode 136 so as to cover the light emitting element 140 (FIG. 4A). In this manner, the element portion 170 including the thin film transistor 106 and the light emitting element 140 can be formed. The insulating layer 138 serves as a protective layer of the light emitting element 140, and is provided in order to prevent entry of moisture or damages to the EL layer 134 in a later pressure-bonding process of the second substrate or the like. In addition, the insulating layer 138 also serves as a heat insulating layer to prevent the EL layer 134 from being heated when the second substrate is pressure-bonded. For example, the insulating layer 138 is formed using an inorganic compound to be a single layer or a stacked layer by a sputtering method, a plasma CVD method, a coating method, a printing method, or the like. Typical examples of an inorganic compound include silicon oxide, silicon nitride, silicon oxynitride, silicon nitride oxide, and the like. In addition, a film with favorable coverage is preferably used for the insulating layer 138. Alternatively, a stacked-layer film of an organic compound and an inorganic compound may be used for the insulating layer 138. When silicon nitride, silicon nitride oxide, silicon oxynitride, or the like is used for the insulating layer 138, entry of moisture or gas such as oxygen from outside into the element layer to be formed later can be prevented. The thickness of the insulating layer functioning as a protective layer is preferably in the range of from 10 nm to 1000 nm, more preferably, from 100 nm to 700 nm.

Figure 4B:
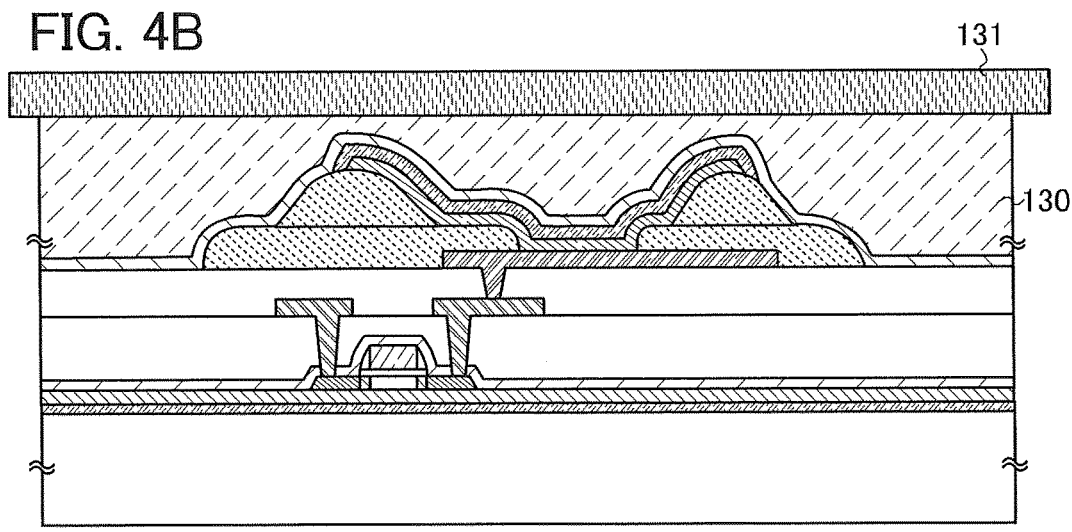

Next, the resin film 130 is formed over the element portion 170 as illustrated in FIG. 4B. The resin film 130 can be formed, for example, in such a manner that a composition is applied by a coating method and then dried by heating. Since the resin film 130 serves as a protective layer of the light emitting element in a later separation process, the resin film 130 preferably has less unevenness on its surface. In addition, a material having a favorable fixing strength with the insulating layer 138 is preferably used as the resin film 130. Specifically, when the resin film 130 is formed by a coating method, examples of the material used for the resin film 130 include organic compounds such as acrylic resins, polyimide resins, melamine resins, polyester resins, polycarbonate resins, phenol resins, epoxy resins, polyacetal, polyether, polyurethane, polyamide (nylon), furan resins, or diallylphthalate resins; inorganic siloxane polymers including a Si—O—Si bond among compounds including silicon, oxygen, and hydrogen faulted by using a siloxane polymer-based material typified by silica glass as a starting material; and organic siloxane polymers in which hydrogen bonded to silicon is substituted by an organic group such as methyl or phenyl, typified by alkylsiloxane polymers, alkylsilsesquioxane polymers, silsesquioxane hydride polymers, alkylsilsesquioxane hydride polymers. Alternatively, a structure in which a fibrous body is impregnated with an organic resin may be used as the resin film 130.

In addition, when light is extracted from the second electrode 136 side of the light emitting element 140, the resin film 130 is formed using a material having a light-transmitting property or is formed so as to have a thickness small enough to transmit light at least on a display surface of the light emitting device. On the other hand, when light is extracted from only the first electrode 122 side of the light emitting element 140, the resin film 130 is not necessarily formed using a material having a light-transmitting property.

Next, an adhesive sheet 131 is attached to the resin film 130. For the adhesive sheet 131, a sheet which can be separated by light or heat is used. The attachment of the adhesive sheet 131 can facilitate separation, further reduce stress that is applied to the element portion 170 before and after separation, and suppress damages to the thin film transistor 106 and the light emitting element 140. Note that when a plurality of panels of light emitting devices is formed from one substrate (a method for obtaining multiple panels from one substrate is employed), etching is conducted to end portions of each region where the panel is formed and the substrate is divided into elements that form the panels before the adhesive sheet 131 is provided. Alternatively, it is possible that the element portion is sandwiched by the first substrate and the second substrate, and then is separated into element portions by dicing or the like.

Figure 4C:
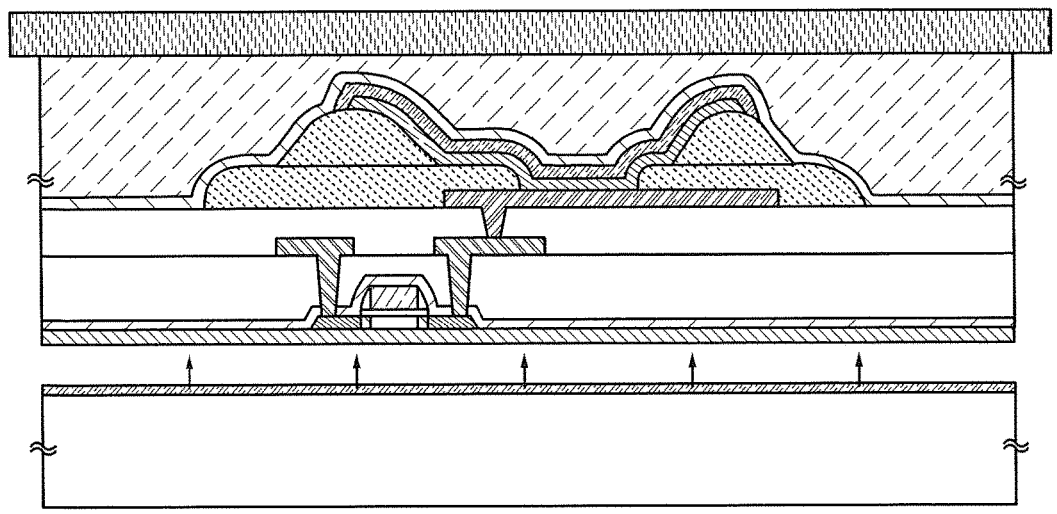

Next, the element portion 170 including the thin film transistor 106, the light emitting element 140 and the like is separated from the substrate 100 (FIG. 4C). As a separation method, any of various methods can be employed. For example, when a metal oxide layer is formed as the separation layer 102 on the side that is contact with the insulating layer 104, the metal oxide layer is weakened by crystallization so that the element portion 170 can be separated from the substrate 100. In addition, when a substrate having a light-transmitting property is used as the substrate 100 and a film containing nitrogen, oxygen, hydrogen or the like (e.g., an amorphous silicon film containing hydrogen, an alloy containing hydrogen, an alloy containing oxygen or the like) is used as the separation layer 102, the separation layer 102 is irradiated with laser light through the substrate 100, and nitrogen, oxygen, or hydrogen contained in the separation layer is evaporated so that separation can occur between the substrate 100 and the separation layer 102. Alternatively, the separation layer 102 may be etched to be removed such that the element portion 170 can be separated from the substrate 100.

Alternatively, a method of removing the substrate 100 by mechanical grinding or a method of removing the substrate 100 by etching using a halogen fluoride gas such as $NF_3$, $BrF_3$, $ClF_3$ or the like or HF, or the like can be employed. In that case, the separation layer 102 is not necessarily used. In addition, it is possible that when a metal oxide layer is formed as the separation layer 102, on the side that is contact with the insulating layer 104, the metal oxide layer is weakened by crystallization and a portion of the separation layer 102 is removed by a solution or by etching using a halogen fluoride gas such as $NF_3$, $BrF_3$, or $ClF_3$, and thus separation can occur in the weakened metal oxide film.

Alternatively, it is also possible that a groove to expose the separation layer 102 is formed by laser irradiation, etching using a gas, a solution or the like, with a sharp knife or a scalpel, separation of the element portion 170 from the substrate 100 can occur at the interface of the separation layer 102 and the insulating layer 104 serving as a protective layer, since the groove triggers the separation. For example, as a separation method, mechanical force (a separation process with a human hand or with a gripper, a separation process by rotation of a roller, or the like) may be used. Alternatively, a liquid may be dropped into the groove to be infiltrated into the interface between the separation layer 102 and the insulating layer 104, so that the element portion 170 can be separated from the separation layer 102. Alternatively, a method can be employed in which a fluoride gas such as $NF_3$, $BrF_3$, or $ClF_3$ is introduced into the groove, and the separation layer is removed by etching with the use of the fluoride gas so that the element portion 170 is separated from the substrate having an insulating surface. Further, the separation may be conducted while a liquid such as water is being poured.

As another separation method, if the separation layer 102 is formed of tungsten, separation can be conducted while the separation layer is being etched by a mixed solution of ammonia water and hydrogen peroxide water.

In general, the fixing strength between the EL layer including an organic compound and the second electrode formed of an inorganic compound is extremely low and film peeling sometimes occurs at the interface between the EL layer and the second electrode in the separation process. However, in the light emitting element 140 described in this embodiment, the insulating layer 137 having a convex portion is provided and the insulating layer 137 (or the convex portion of the insulating layer 137) is embedded in the resin film 130. That is, the resin film 130 covers an entire surface of the insulating layer 137 (or the convex portion of the insulating layer 137) and an entire surface of the second electrode. Because the insulating layer 137 functions as a wedge (has so-called anchoring effect) in the resin film 130, the fixing strength of the resin film 130 and the insulating layer 137 can be improved. Accordingly, separation is difficult to occur at the interface between the EL layer 134 and the second electrode 136 in the separation process, and thus the element portion 170 can be separated from the substrate 100 with high yield.

Figure 5A:
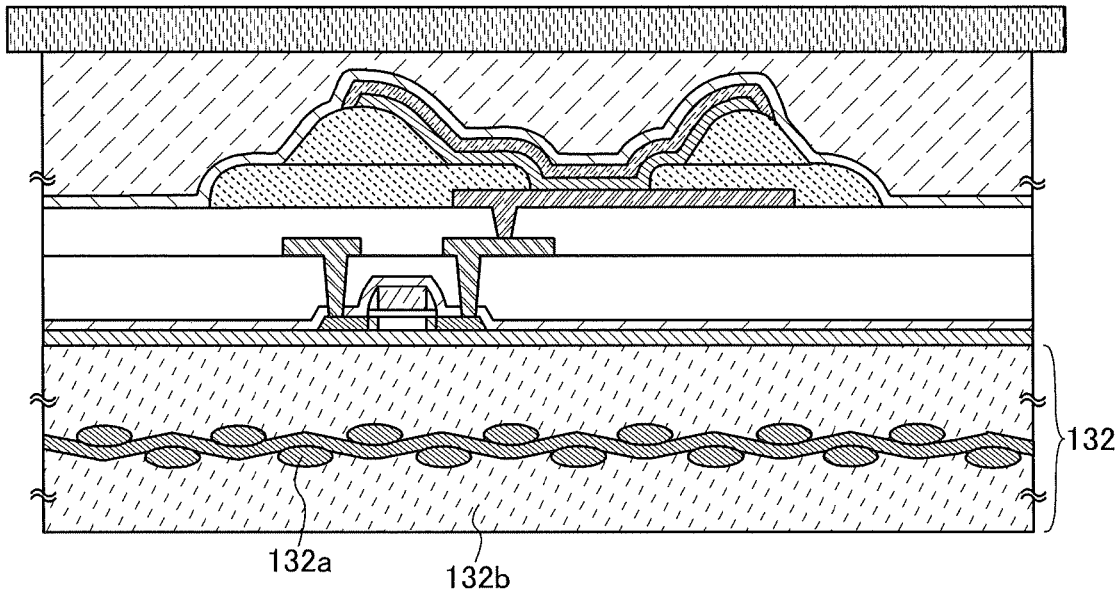
FIGS. 5A and 5B illustrate the method for manufacturing the light emitting device according to one embodiment of the present invention.

Next, the first substrate 132 is provided on the side of the separation face (the surface exposed by separation, of the insulating layer 104) of the element portion 170 separated. In this embodiment, as the first substrate 132, a first structure in which the fibrous body 132a is impregnated with the organic resin 132b is used (FIG. 5A). The structure is also called a prepreg.

The prepreg is specifically formed in a following manner: after a fibrous body is impregnated with a varnish in which a matrix resin is diluted with an organic solvent, drying is performed so that the organic solvent is volatilized and the matrix resin is semi-cured. The thickness of the structure is preferably from 10 µm to 100 µm, more preferably from 10 µm to 30 µm. When a structure with such a thickness is used, a thin and flexible light emitting device can be manufactured.

As the organic resin 132b, a thermosetting resin, an ultraviolet curable resin or the like can be used. Typical examples include epoxy resins, unsaturated polyester resins, polyimide resins, bismaleimide triazine resins, cyanate resins, and the like. Alternatively, a thermoplastic resin such as a polyphenylene oxide resin, a polyetherimide resin, or a fluorine resin may be used. By using the above organic resin, the fibrous body can be fixed to the semiconductor integrated circuit by heat treatment. The higher the glass transition temperature of the organic resin 132b is, the less the organic resin 132b is destroyed by local pressing force, which is preferable.

Highly thermally-conductive filler may be dispersed in the organic resin 132b or the yarn bundle of the fibrous body 132a. As the highly thermally-conductive filler, aluminum nitride, boron nitride, silicon nitride, alumina, and the like can be given. As the highly thermally-conductive filler, particles of a metal such as silver or copper can also be given. When a conductive filler is included in the organic resin or the yarn bundles of fibers, heat can be easily released to the outside. Accordingly, thermal storage in the light emitting device can be suppressed and thus the light emitting device can be prevented from being damaged.

The fibrous body 132a is a woven or nonwoven fabric using high-strength fibers of an organic compound or an inorganic compound and fibrous bodies are provided so as to partly overlap with each other. The high-strength fiber is specifically a fiber with a high modulus of elasticity in tension or a fiber with a high Young's modulus. Typical examples of high-strength fiber include polyvinyl alcohol fibers, polyester fibers, polyamide fibers, polyethylene fibers, aramid fibers, polyparaphenylene benzobisoxazole fibers, glass fibers, carbon fibers, and the like. As the glass fiber, glass fiber using E glass, S glass, D glass, Q glass, or the like can be used. Note that the fibrous body 132a may be formed from one kind or plural kinds of the above-described high-strength fibers. Note that it is preferable to use materials having substantially the same level of refractive index for the fibrous body 132a and the organic resin 132b.

The fibrous body 132a may be a woven fabric which is woven using bundles of fibers (single yarns) (hereinafter, the bundles of fibers are referred to as yarn bundles) for warp yarns and weft yarns, or a nonwoven fabric obtained by stacking yarn bundles of plural kinds of fibers in a random manner or in one direction. In the case of the woven fabric, a plain weave, a twill weave, a satin weave, or the like can be used as appropriate.

The yarn bundle may have a circular shape or an elliptical shape in cross section. As the yarn bundle of fibers, a yarn bundle of fibers may be used, which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in its cross section. Further, by using a loosely twisted yarn as the yarn bundle of fibers, the yarn bundle is easily flattened and has an elliptical shape or a flat shape in cross section. Using a yarn bundle having an elliptical shape or a flat shape in cross section in this manner can reduce the thickness of the fibrous body 132a. Accordingly, the thickness of the structure can be reduced and thus a thin light emitting device can be manufactured.

Next, the first structure used as the first substrate 132 is heated and pressure-bonded so that the organic resin 132b of the first structure is plasticized, semi-cured, or cured. The temperature for heating the first substrate 132 is preferably 100° C. or lower. In the case where the organic resin 132b is an organic plastic resin, the organic resin which has been plasticized is cured by cooling to room temperature. Alternatively, the first structure may be irradiated with ultraviolet rays and pressure-bonded to semi-cure or cure the organic resin 132b. By heating or ultraviolet irradiation and pressure bonding, the organic resin 132b is uniformly spread over the surface of the element formation layer 124 and cured. The pressure bonding of the first structure can be performed under an atmospheric pressure or low pressure.

Figure 5B:
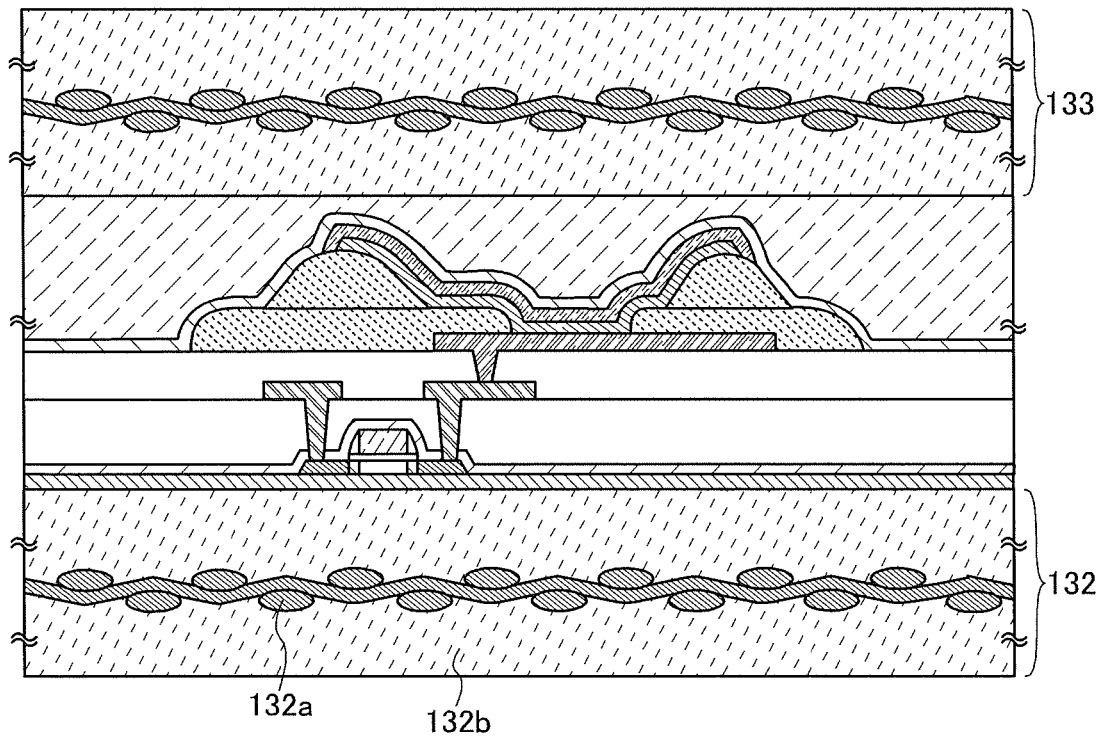

After the first structure is pressure-bonded, the adhesive sheet 131 is removed to expose the resin film 130. Then, the second substrate 133 is provided over the resin film 130 (FIG. 5B). In this embodiment, a second structure in which a fibrous body is impregnated with an organic resin is used as the second substrate 133, similar to the first substrate 132. After that, the second structure is heated and subjected to pressure bonding so that the organic resin 132b of the second structure is plasticized or cured.

Alternatively, the second structure may be irradiated with ultraviolet rays and subjected to pressure bonding such that the organic resin 132b is cured. Note that the resin film 130 can function as the second substrate 133. In that case, the second substrate 133 is not necessarily provided.

Through the above process, the light emitting device of this embodiment having the light emitting element sandwiched by the first substrate and the second substrate can be formed.

Figure 6A:
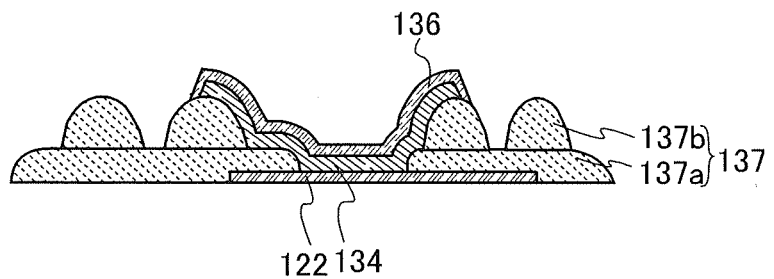
FIGS. 6A to 6C each illustrate an example of a structure of a light emitting element.
Figure 6B:
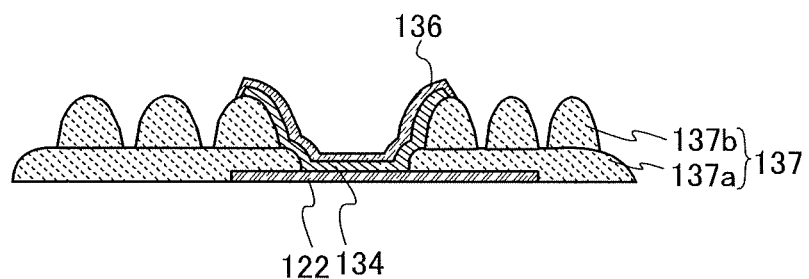

In this embodiment, the insulating layer 137 serving as a partition has the structure having a convex portion, in which the first insulating layer 137a is formed and one second insulating layer 137b is formed thereover, but this is a non-limiting example. It is acceptable that the insulating layer 137 serving as a partition is embedded in the resin film 130, and the surface area of the insulating layer is large so as to improve the fixing strength with the resin film 130, and the insulating layer has a convex portion. For example, as in the light emitting element illustrated in FIG. 6A, two second insulating layers 137b may be formed over one first insulating layer 137a as the insulating layer 137 having a convex portion. The second insulating layer 137b can be formed by a photolithography method, a screen printing method, an inkjet method or the like. In addition, as in the light emitting element illustrated in FIG. 6B, three second insulating layers 137b may be formed over one first insulating layer 137a as the insulating layer 137 having a convex portion. As the surface area of the insulating layer 137 is increased, preferably, the anchoring effect is obtained more, which leads to improvement of the fixing strength between the insulating layer 137 and the resin film 130. Note that in the pair of insulating layers 137 covering end portions of the first electrode, the number of convex portions may be different in the insulating layers 137 from each other. Note that in a case where a plurality of insulating layers 137b are provided over one first insulating layer 137a, preferably, the contact area of the plurality of the second insulating layers 137b with the first insulating layer 137a is smaller than the top area of the first insulating layer 137a, and the plurality of second insulating layers 137b is provided within the area over the first insulating layer 137a.

Figure 6C:
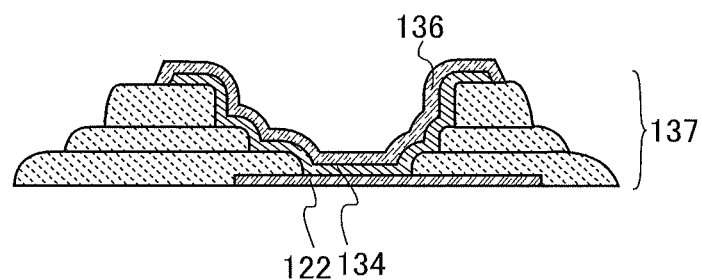

In addition, as in the light emitting element illustrated in FIG. 6C, the insulating layer 137 may have a stacked structure of three layers or more. Note that the thickness of the insulating layer 137 (the height from the surface of the insulating layer 120 to the outermost surface of the insulating layer 137) is preferably in the range of from 300 nm to 5 µm. By employing a thickness of 300 nm or larger for the thickness of the insulating layer, an excellent insulating property can be obtained. In addition, by employing the thickness of 5 µm or smaller, the insulating layer 137 can be formed with high productivity.

Although this embodiment has been described the example where structures in which the fibrous body is impregnated with the organic resin (so-called prepreg) are used for the first substrate 132 and the second substrate 133, the embodiments of the present invention are not limited to this example. For example, as the first substrate 132 or the second substrate 133, a flexible substrate or a film made of a resin such as a polyester resin such as polyethylene terephthalate (PET), polyethylene naphthalate (PEN), an acrylic resin, a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamideimide resin, a polyvinyl chloride resin or the like can be used and then attached to the insulating layer 104 or the resin film 130 by an adhesive. As the material of the adhesive, various curable adhesives such as a reactive curable adhesive, a thermal curable adhesive, a photo curable adhesive such as an ultraviolet curable adhesive, an anaerobic adhesive, or the like can be used. As the material of the adhesive, an epoxy resin, an acrylic resin, a silicone resin, a phenol resin, or the like can be used. Note that a substrate having a light-transmitting property is used for at least the substrate through which light is extracted from the light emitting element 140.

Further, a metal substrate may be used for the first substrate 132 or the second substrate 133. The metal substrate preferably has a thickness of from 10 µm to 200 µm so as to be flexible. More preferably, the metal substrate has a thickness of from 20 µm to 100 µm for high flexibility. There is no particular limitation on the material used for the metal substrate, but metal such as aluminum, copper or nickel, an aluminum alloy, a metal alloy such as stainless steel, or the like can be preferably used. Such a metal substrate can be attached to the insulating layer 104 or the resin film 130 by an adhesive. Note that the metal substrate is preferably subjected to baking in vacuum or plasma treatment in order that moisture attached on its surface can be removed, before the metal substrate is attached by an adhesive.

Because such a metal substrate has low water permeability, the use of such a metal substrate as a support of a light emitting device can prevent water from entering the light emitting element 140, and thus the light emitting device can have a longer lifetime. Note that such a metal substrate has both flexibility and low water permeability, but has low light-transmitting property of visible light, and thus such a metal substrate is preferably used for one substrate of the pair of substrates provided to sandwich the light emitting element in the light emitting device.

Figure 7A:
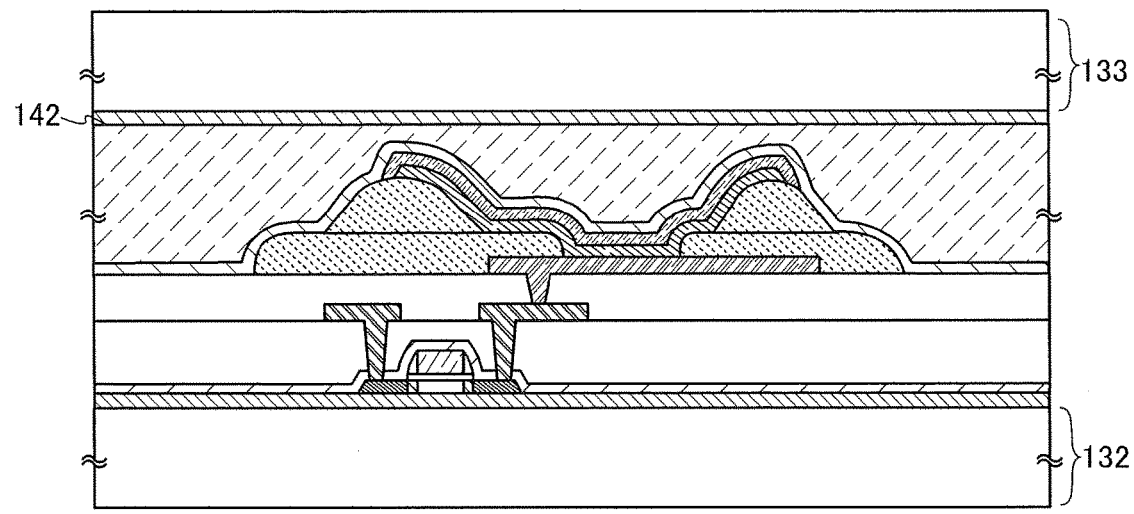
FIGS. 7A and 7B each illustrate an example of a structure of a light emitting device according to one embodiment of the present invention.

In addition, as illustrated in FIG. 7A, a desiccant 142 may be provided between the resin film 130 and the second substrate 133. By sealing the desiccant 142 therebetween, deterioration of the light emitting element due to moisture can be prevented. The desiccant may be a substance which absorbs moisture by chemical adsorption, such as an oxide of an alkaline earth metal such as calcium oxide or barium oxide. Note that a substance which adsorbs moisture by physical adsorption such as zeolite or silica gel may be used as well. When light is extracted from the second electrode 136 side of the light emitting element 140, a desiccant is preferably disposed in a region not overlapping a pixel region (e.g., a periphery portion of a pixel region), so that the aperture ratio is not decreased.

Figure 7B:
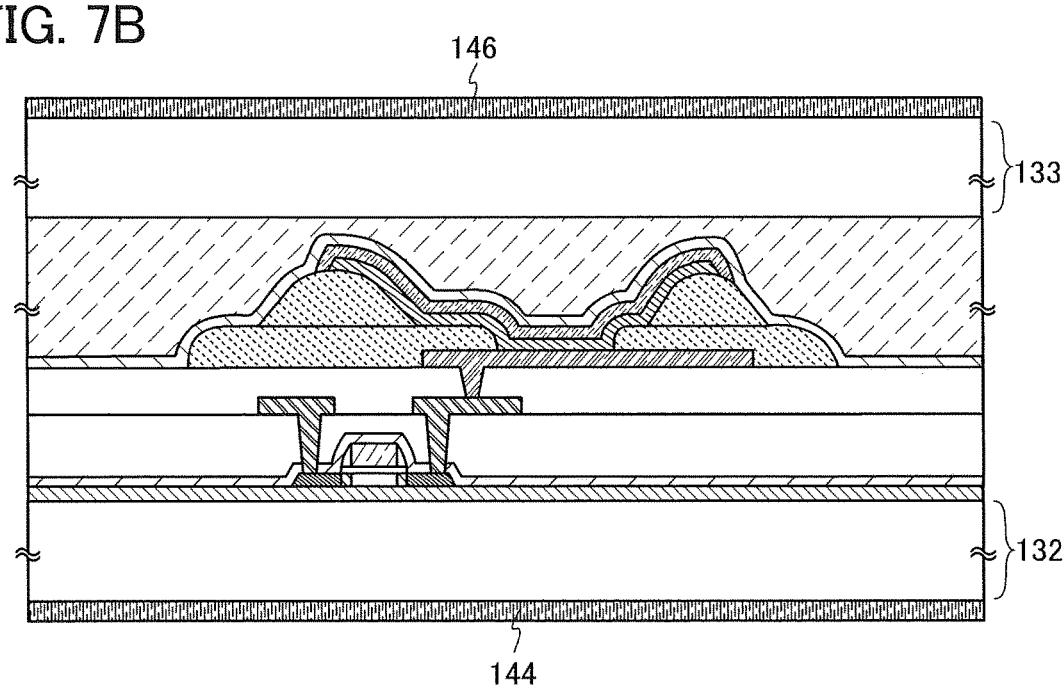

In addition, as illustrated in FIG. 7B, a first impact release layer 144 and a second impact release layer 146 may be provided outside the first substrate 132 and the second substrate 133 (on the side where the light emitting element 140 is not provided), respectively.

The impact release layers have an effect of diffusing and reducing force to be applied to the light emitting device from the outside. Accordingly, as illustrated in FIG. 7B, by providing the impact release layers against force applied to the light emitting device from the outside (also referred to as external stress), locally applied force can be alleviated. Therefore, the strength of the light emitting device can be increased, and damage, defective characteristics and the like of the light emitting device can be prevented.

For example, for the first impact release layer 144 and the second impact release layer 146, films having rubber elasticity in which the modulus of elasticity is from 5 GPa to 12 GPa and the modulus of rupture is 300 MPa or higher can be used. Note that materials with a lower elasticity and a higher breaking strength than the first substrate 132 and the second substrate 133 are preferably used.

The first impact release layer 144 and the second impact release layer 146 are preferably formed using high-strength materials. Typical examples of a high-strength material include polyvinyl alcohol resins, polyester resins, polyamide resins, polyethylene resins, aramid resins, polyparaphenylene benzobisoxazole resins, glass resins, and the like. By providing the first impact release layer 144 and the second impact release layer 146 formed using high-strength materials with elasticity, a load such as local pressure is diffused to and absorbed by the entire layer, so that the light emitting device can be prevented from being damaged.

Specifically, as the first impact release layer 144 and the second impact release layer 146, an aramid resin, a polyethylene naphthalate (PEN) resin, a polyethersulfone (PES) resin, a polyphenylene sulfide (PPS) resin, a polyimide (PI) resin, a polyethylene terephthalate (PET) resin, or the like can be used. In this embodiment, an aramid film made of an aramid resin is used for each of the first impact release layer 144 and the second impact release layer 146.

The first substrate 132 and the first impact release layer 144 or the second substrate 133 and the second impact release layer 146 can be attached to each other by an adhesive (not illustrated). In addition, when as the first substrate 132 and the second substrate 133, structures in which a fibrous body is impregnated with an organic resin are used, it is possible that they can be directly bonded by heating and pressurizing, without an adhesive disposed therebetween.

Note that although FIG. 7B illustrates the example in which the impact release layers are provided for both sides outside the first substrate 132 and the second substrate 133, the impact release layer may be provided outside either the first substrate 132 or the second substrate 133. Note that it is preferable that as illustrated in FIG. 7B, when a pair of impact release layers are symmetrically provided with respect to the element portion 170, force applied to the light emitting device can be distributed uniformly; therefore, damages to the element portion 170 due to bending, warpage, or the like can be prevented. Further, when a pair of substrates or a pair of impact release layers are formed using the same material to the same thickness, they can have an equivalent characteristic, whereby the force applied becomes more distributed.

In the light emitting device described in this embodiment, the insulating layer 137 has a convex portion, and this convex portion is embedded in the resin film 130 whereby the fixing strength of the insulating layer 137 and the resin film 130 can be improved. Therefore, peeling does not occur inside the light emitting element in the manufacturing process of the light emitting device, and thus the light emitting element can be transferred to a flexible substrate. Accordingly, the light emitting device can be manufactured with high yield and the thus formed light emitting device can have high reliability.

By providing a pair of structures sandwiching the element portion for the light emitting device in this embodiment, force locally applied to the light emitting element can be alleviated; therefore, damage, defective characteristics, and the like of the light emitting device due to external stress can be prevented. Accordingly, a highly reliable light emitting device that is reduced in thickness and size and has durability can be provided. Further, a light emitting device can be manufactured with a high yield by preventing defects of a shape and characteristics due to external stress in a manufacture process.

This embodiment can be combined with any of the embodiments as appropriate.

Embodiment 4

In Embodiment 4, an example of a module type light emitting device (referred to as also EL module) will be described referring to a top view and a cross-sectional view of FIGS. 8A and 8B.

Figure 8A:
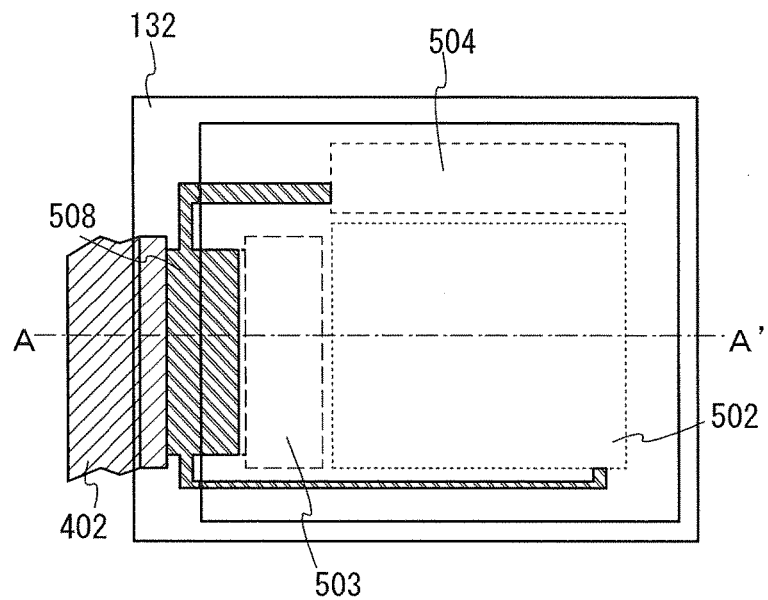
FIGS. 8A and 8B illustrate a light emitting device according to one embodiment of the present invention.
Figure 8B:
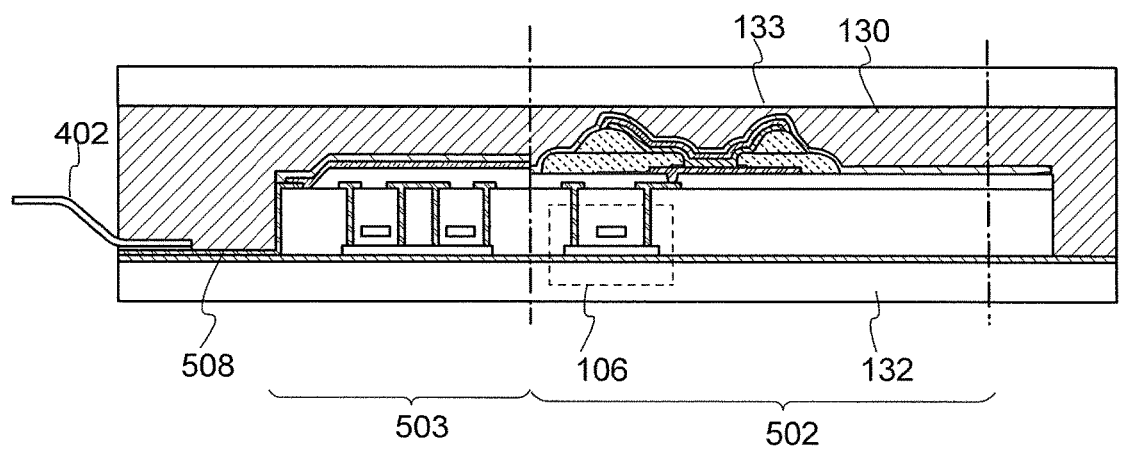

FIG. 8A is a top view illustrating an EL module formed in the manner described in the above embodiments, and FIG. 8B is a cross-sectional view taken along A-A' of FIG. 8A. In FIG. 8A, a pixel portion 502, a source side driver circuit 504, and a gate side driver circuit 503 are formed over the first substrate 132.

Reference numeral 508 denotes a wiring to transmit signals to the source side driver circuit 504 and the gate side driver circuit 503, and the wiring can be formed at the same time as a wiring included in a switching element of the pixel portion. The wiring 508 receives a video signal, a clock signal, a start signal, a reset signal, and the like from an FPC (flexible printed circuit) 402 that is an external input terminal. Although only the FPC 402 is depicted in FIGS. 8A and 8B, a printed wiring board (PWB) may be provided to the FPC 402. The light emitting device in this specification includes not only a light emitting device body itself but also a state in which an FPC or a PWB is attached thereto.

Next, the sectional structure will be described with reference to FIG. 8B. The pixel portion 502 and the gate side driver circuit 503 are formed over the first substrate 132, and the pixel portion 502 includes a plurality of pixels each including the thin film transistor 106 and a first electrode electrically connected to the drain of the thin film transistor 106. The FPC 402 which is an external input terminal is attached on the wiring 508 provided for the first substrate 132 with an anisotropic conductive agent or the like therebetween. By conductive particles included in the anisotropic conductive agent, the wiring 508 and a wiring formed in the FPC 402 are electrically connected to each other. In FIGS. 8A and 8B, the FPC 402 is sandwiched by the first substrate 132 and the second substrate 133.

In this manner, the modular light emitting device to which the FPC 402 is connected can be obtained.

This embodiment can be combined with any of the embodiments as appropriate.

Embodiment 5

The light emitting device described in any of the above-described embodiments can be used as a display portion of an electronic device. Electronic devices described in this embodiment have the light emitting device of any of the embodiments. By the method for manufacturing a light emitting device according to any of the above-described embodiments, a highly reliable light emitting device can be obtained with a high yield. As a result, an electronic device can be formed with high throughput and high quality as an end product.

The light emitting device described in any of the above-described embodiments can be used, e.g., for display portions of various electronic devices such as display devices, computers, mobile phones, or cameras. The light emitting device described in any of the above-described embodiments is used for a display portion, whereby a thin and lightweight electronic device with high reliability can be provided.

Figure 9A:
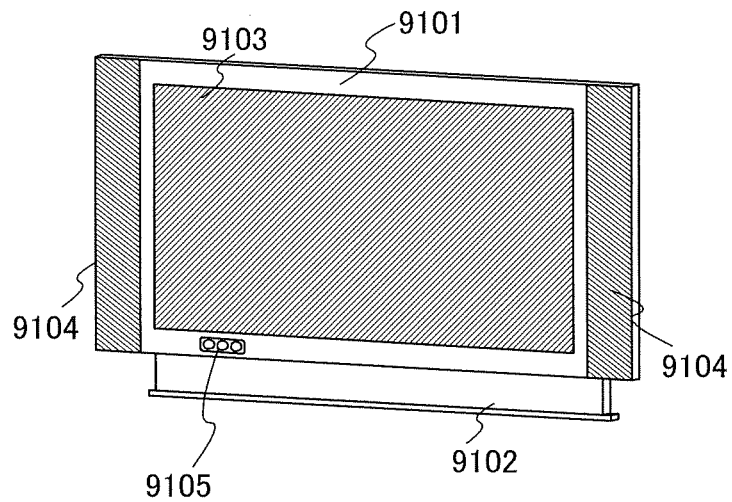
FIGS. 9A to 9E each illustrate an application example of a light emitting device according to one embodiment of the present invention.

FIG. 9A illustrates a television set which includes a housing 9101, a supporting base 9102, a display portion 9103, speaker portions 9104, video input terminals 9105, and the like. The display portion 9103 of the television device is manufactured using the light emitting device described in any of the above-described embodiments. The television set mounting the light emitting device of any of the above-described embodiments, which is flexible, has a long lifetime and is easy to manufacture, can be a highly reliable product that can realize display on a curved face and lightweight with use of the display portion 9103.

Figure 9B:
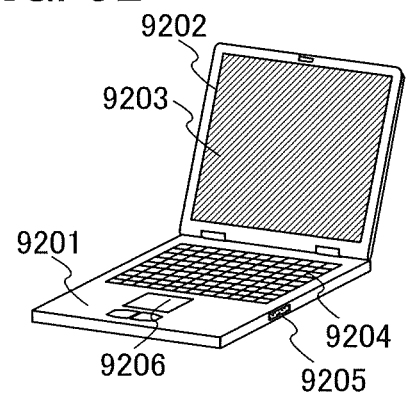

FIG. 9B illustrates a computer which includes a main body 9201, a chassis 9202, a display portion 9203, a keyboard 9204, an external connection port 9205, a pointing device 9206, and the like. The display portion 9203 of the computer is manufactured using the light emitting device described in any of the above-described embodiments. The computer mounting the light emitting device of any of the above-described embodiments, which is flexible, has a long lifetime and is easy to manufacture, can be a highly reliable product that can realize display on a curved face and lightweight with use of the display portion 9203.

Figure 9C:
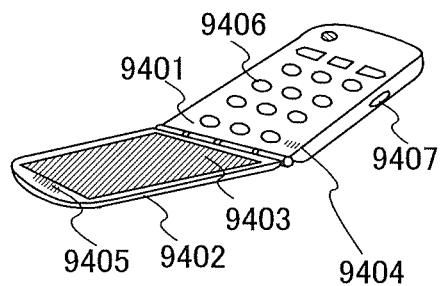

FIG. 9C illustrates a mobile phone which includes a main body 9401, a chassis 9402, a display portion 9403, an audio input portion 9404, an audio output portion 9405, an operation key 9406, an external connection port 9407, and the like. The display portion 9403 of the mobile phone is manufactured using the light emitting device described in any of the above-described embodiments. The mobile phone mounting the light emitting device of any of the above-described embodiments which is flexible, has a long lifetime and is easy to manufacture can be a highly reliable product that can realize display on a curved face and lightweight with use of the display portion 9403. The lightweight mobile phone in this embodiment can have a size and weight suitable for portable phones, even when various additional values are added to the mobile phone, and is suitable for a high functional mobile phone.

Figure 9D:
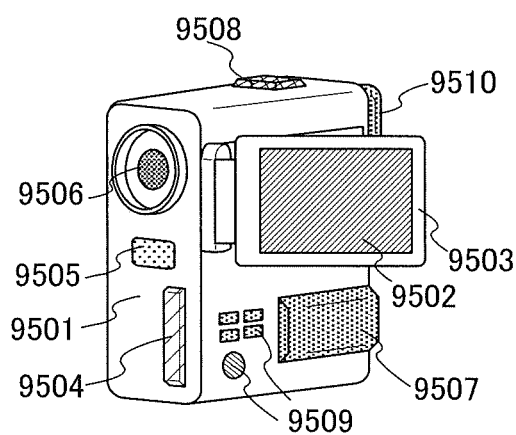

FIG. 9D illustrates a camera which includes a main body 9501, a display portion 9502, a housing 9503, an external connection port 9504, a remote control receiver portion 9505, an image receiving portion 9506, a battery 9507, an audio input portion 9508, operation keys 9509, an eyepiece portion 9510, and the like. The display portion 9502 of the camera is manufactured using the light emitting device described in any of the above-described embodiments. The camera mounting the light emitting device of any of the above-described embodiments, which is flexible, has a long lifetime and is easy to manufacture, can be a highly reliable product that can realize display on a curved face and lightweight with use of the display portion 9502.

Figure 9E:
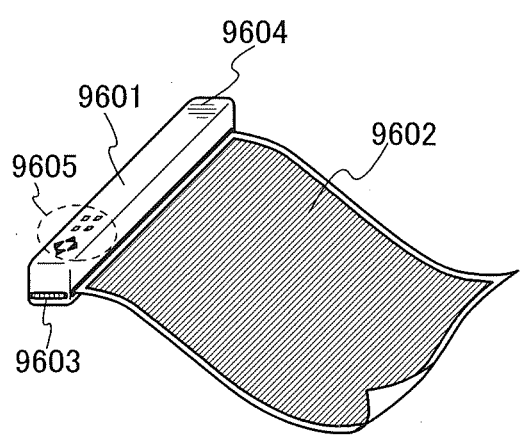

FIG. 9E illustrates a display which includes a main body 9601, a display portion 9602, an external memory insert portion 9603, a speaker portion 9604, operation keys 9605, and the like. The main body 9601 may be further mounted with an antenna for receiving an image to be displayed on a television, an external input terminal, an external output terminal, a battery, and the like. The display portion 9602 of the display is manufactured using the light emitting device described in any of the above-described embodiments. The flexible display portion 9602 can be stored in the main body 9601 by being rolled up, which is suitable for being carried along. The display mounting the light emitting device of any of the above-described embodiments, which can be flexible, can be a highly reliable product that can realize portability and lightweight with use of the display portion 9602.

As described above, the application range of the light emitting devices formed using the light emitting device described in any of the above embodiments is so wide that the light emitting device can be applied to electronic devices in all fields.

The light emitting device described in any of the above-described embodiments can also be used as a lighting device. One mode of the light emitting device used for a lighting device is described with reference to FIG. 10.

Figure 10:
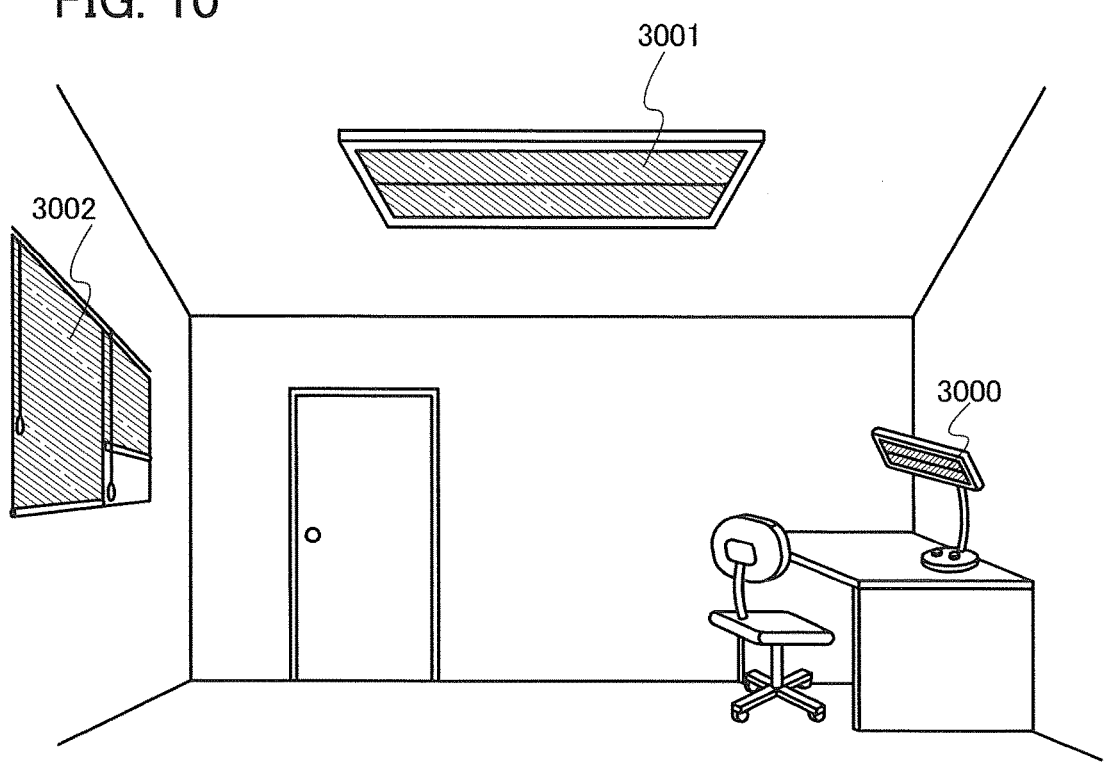
FIG. 10 illustrates application examples of a light emitting device according to one embodiment of the present invention.

FIG. 10 illustrates an example in which the light emitting device, which has been described as one example in any of the above-described embodiments, is applied as a desk lamp 3000 that is a lighting device, and interior lighting devices 3001 and 3002. The desk lamp 3000 illustrated in FIG. 10 uses the light emitting device described as one example in any of the above-described embodiments as a light source. Accordingly, the desk lamp can realize lightweight and high reliability. In addition, by using the light emitting device described in any of the above-described embodiments, the interior lighting devices 3001 and 3002 can be reduced in their weights and have high reliability. In addition, since this light emitting device can be flexible, it can be, for example, a roll-type lighting device like the lighting device 3002.

The lighting devices are not limited to those exemplified in FIG. 10, and the light emitting device described in any of the above-described embodiments can be applied to lighting devices in various modes, including lighting devices for houses and public facilities. In that case, a light emitting medium of the lighting device using the light emitting device described in any of the above-described embodiments is a thin film, which provides better design freedom. Accordingly, various elaborately-designed products can be provided to the marketplace.

This embodiment can be combined with any of the embodiments as appropriate.

This application is based on Japanese Patent Application serial no. 2009-002567 filed with Japanese Patent Office on Jan. 8, 2009, the entire contents of which are hereby incorporated by reference.

What is claimed is:

1. A light emitting device comprising:
a first substrate;

a light emitting element over the first substrate, comprising:
  a first electrode;
  a first insulating layer covering an end portion of the first electrode;
  an EL layer over the first electrode; and
  a second electrode over the EL layer;
a second insulating layer over the first insulating layer; and
a layer comprising an organic material over the second electrode of the light emitting element,
wherein an entire of a bottom surface of the second insulating layer is in contact with a first region of a top surface of the first insulating layer,
wherein the layer comprising an organic material is in contact with a second region of the top surface of the first insulating layer and the second insulating layer, and
wherein the second insulating layer comprises an organic material.

2. The light emitting device according to claim 1, wherein the first substrate is a flexible substrate.

3. The light emitting device according to claim 1, wherein the layer comprising an organic material comprises a resin.

4. The light emitting device according to claim 1, further comprising: a second substrate over the layer comprising an organic material.

5. The light emitting device according to claim 1, wherein the first insulating layer and the second insulating layer comprise the same material.

6. The light emitting device according to claim 1, wherein the EL layer is over and in contact with the second insulating layer.

7. The light emitting device according to claim 1,
  wherein the first insulating layer and the second insulating layer are embedded in the layer comprising an organic material.

8. An electronic device comprising the light emitting device according to claim 1.

9. A light emitting device comprising:
  a first substrate;
  a light emitting element over the first substrate, comprising:
    a first electrode;
    a first insulating layer covering an end portion of the first electrode;
    an EL layer over the first electrode; and
    a second electrode over the EL layer;
  a second insulating layer over and in contact with a first region of a top surface of the first insulating layer;
  a third insulating layer over and in contact with a second region of the top surface of the first insulating layer;
  a layer comprising an organic material over the second electrode of the light emitting element,
  wherein the layer comprising an organic material is in contact with a third region of the top surface of the first insulating layer, the second insulating layer, and the third insulating layer,
  wherein the second insulating layer and the third insulating layer are spaced from each other, and
  wherein the second insulating layer and the third insulating layer each comprises an organic material.

10. The light emitting device according to claim 9,
  wherein the first substrate is a flexible substrate.

11. The light emitting device according to claim 9,
  wherein the layer comprising an organic material comprises a resin.

12. The light emitting device according to claim 9, further comprising:
  a second substrate over the layer comprising an organic material.

13. The light emitting device according to claim 9,
  wherein the first insulating layer, the second insulating layer and the third insulating layer comprise the same material.

14. The light emitting device according to claim 9,
  wherein the EL layer is over and in contact with at least one of the second insulating layer and the third insulating layer.

15. The light emitting device according to claim 9,
  wherein the first insulating layer and the second insulating layer are embedded in the layer comprising an organic material.

16. An electronic device comprising the light emitting device according to claim 9.

* * * * *